United States Patent
Saito

(10) Patent No.: US 11,651,988 B2
(45) Date of Patent: May 16, 2023

(54) PROCESSING APPARATUS

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/815,781

(22) Filed: Jul. 28, 2022

(65) Prior Publication Data

US 2023/0046388 A1 Feb. 16, 2023

(30) Foreign Application Priority Data

Aug. 10, 2021 (JP) .............................. JP2021-130878

(51) Int. Cl.
| | |
|---|---|
| *B29C 65/00* | (2006.01) |
| *H01L 21/683* | (2006.01) |
| *C23C 16/455* | (2006.01) |
| *H01L 21/67* | (2006.01) |
| *H01L 21/677* | (2006.01) |
| *B29C 65/50* | (2006.01) |
| *B32B 43/00* | (2006.01) |

(52) U.S. Cl.
CPC .... *H01L 21/6836* (2013.01); *C23C 16/45519* (2013.01); *H01L 21/6773* (2013.01); *H01L 21/67103* (2013.01); *H01L 21/6838* (2013.01); *B29C 65/50* (2013.01); *B29C 65/5092* (2013.01); *B32B 43/006* (2013.01); *Y10T 156/1132* (2015.01); *Y10T 156/1944* (2015.01)

(58) Field of Classification Search
CPC ............. B32B 43/006; Y10T 156/1132; Y10T 156/1944; B29C 65/50; B29C 65/5092
See application file for complete search history.

(56) References Cited

U.S. PATENT DOCUMENTS

| | | | | |
|---|---|---|---|---|
| 2007/0231929 | A1* | 10/2007 | Kajiyama | ......... H01L 21/67132 438/6 |
| 2007/0238264 | A1* | 10/2007 | Sekiya | .............. H01L 21/67132 438/464 |
| 2010/0000654 | A1* | 1/2010 | Kondo | ................ H01L 21/6836 156/60 |
| 2015/0332928 | A1* | 11/2015 | Priewasser | ........ H01L 21/67046 438/460 |
| 2017/0301571 | A1* | 10/2017 | Tsuchiya | ............. H01L 21/6836 |
| 2020/0075311 | A1* | 3/2020 | Osaga | ............... H01L 21/76862 |

FOREIGN PATENT DOCUMENTS

JP 2010062375 A 3/2010

\* cited by examiner

*Primary Examiner* — Philip C Tucker
*Assistant Examiner* — Nickolas R Harm
(74) *Attorney, Agent, or Firm* — Greer Burns & Crain Ltd.

(57) ABSTRACT

A processing apparatus includes a wafer cassette table, a wafer carrying-out mechanism, a wafer table, a frame housing unit, a frame carrying-out mechanism, a frame table, a tape sticking unit, a tape-attached frame conveying mechanism, a tape pressure bonding unit, a frame unit carrying-out mechanism, a reinforcing part removing unit, a ring-free unit carrying-out mechanism, and a frame cassette table. The wafer carrying-out mechanism includes a Bernoulli chuck mechanism that jets gas to the back surface of the wafer and generates a negative pressure. The gas jetted by the Bernoulli chuck mechanism is inert gas. The wafer carrying-out mechanism jets the inert gas from the Bernoulli chuck mechanism to suppress oxidation of the back surface of the wafer when the wafer is carried out.

3 Claims, 20 Drawing Sheets

PROCESSING APPARATUS

BACKGROUND OF THE INVENTION

Field of the Invention

The present invention relates to a processing apparatus that removes a ring-shaped reinforcing part with a projecting shape from a wafer in which the ring-shaped reinforcing part is formed into the projecting shape on a part of a back surface corresponding to an outer circumferential surplus region.

Description of the Related Art

A wafer in which a device region in which plural devices such as an integrated circuit (IC) and large-scale integration (LSI) are marked out by planned dividing lines and an outer circumferential surplus region that surrounds the device region are formed in a front surface is formed into a desired thickness through grinding of a back surface. Thereafter, the wafer is divided into individual device chips by a dicing apparatus or a laser processing apparatus and the respective device chips obtained by the dividing are used for pieces of electrical equipment such as mobile phones and personal computers.

The present assignee has proposed the following technique. Predetermined processing is executed in such a manner that a ring-shaped reinforcing part is left on a part of a back surface corresponding to an outer circumferential surplus region in order to make conveyance of a ground wafer easy. Thereafter, a dicing tape is stuck to the back surface of the wafer, and the wafer is supported by a frame. Then, the ring-shaped reinforcing part is removed from the wafer (for example, refer to Japanese Patent Laid-Open No. 2010-62375).

SUMMARY OF THE INVENTION

However, there is the following problems. Work of sticking the dicing tape to the back surface of the wafer in which the ring-shaped reinforcing part is formed into a projecting shape on the part of the back surface corresponding to the outer circumferential surplus region to integrate the wafer with the frame is difficult. In addition, it is difficult to cut the ring-shaped reinforcing part and remove it from the wafer. Thus, the productivity is low.

Thus, an object of the present invention is to provide a processing apparatus with which work of sticking a dicing tape to the back surface of a wafer in which a ring-shaped reinforcing part is formed into a projecting shape on a part of the back surface corresponding to an outer circumferential surplus region to integrate the wafer with a frame is easy and it is easy to cut the ring-shaped reinforcing part and remove it from the wafer.

In accordance with an aspect of the present invention, there is provided a processing apparatus that removes a ring-shaped reinforcing part with a projecting shape from a wafer, the ring-shaped reinforcing part being formed into the projecting shape on a part of a back surface of the wafer, the part of the back surface corresponding to an outer circumferential surplus region. The processing apparatus includes a wafer cassette table on which a wafer cassette in which a plurality of wafers are housed is placed, a wafer carrying-out mechanism that carries out the wafer from the wafer cassette placed on the wafer cassette table, a wafer table that supports a front surface side of the wafer carried out by the wafer carrying-out mechanism, a frame housing unit that houses a plurality of ring-shaped frames each of which has an opening part that houses the wafer formed therein, a frame carrying-out mechanism that carries out the frame from the frame housing unit, a frame table that supports the frame carried out by the frame carrying-out mechanism, a tape sticking unit that is disposed above the frame table and sticks a tape to the frame, a tape-attached frame conveying mechanism that conveys the frame to which the tape is stuck to the wafer table, positions the opening part of the frame to the back surface of the wafer supported by the wafer table, and places a tape-attached frame on the wafer table, a tape pressure bonding unit that executes pressure bonding of the tape of the tape-attached frame to the back surface of the wafer, a frame unit carrying-out mechanism that carries out a frame unit in which the tape of the tape-attached frame and the back surface of the wafer are pressure-bonded by the tape pressure bonding unit from the wafer table and temporarily places the frame unit on a temporary placement table, a reinforcing part removing unit that cuts and removes the ring-shaped reinforcing part from the wafer of the frame unit placed on the temporary placement table, a ring-free unit carrying-out mechanism that carries out a ring-free unit resulting from the removal of the ring-shaped reinforcing part from the reinforcing part removing unit, and a frame cassette table on which a frame cassette that houses the ring-free unit carried out by the ring-free unit carrying-out mechanism is placed. The wafer carrying-out mechanism includes a Bernoulli chuck mechanism that jets gas to the back surface of the wafer and generates a negative pressure, and the gas is inert gas, and the wafer carrying-out mechanism jets the inert gas from the Bernoulli chuck mechanism to suppress oxidation of the back surface of the wafer when the wafer is carried out.

Preferably, the tape pressure bonding unit includes an upper chamber disposed above the wafer table, a lower chamber in which the wafer table is housed, a elevating mechanism that raises and lowers the upper chamber and generates a closed state in which the upper chamber is brought into contact with the lower chamber and an opened state in which the upper chamber is separated from the lower chamber, a vacuum part that sets the upper chamber and the lower chamber to a vacuum state in the closed state, and an opening-to-atmosphere part that opens the upper chamber and the lower chamber to atmosphere. The upper chamber sprays inert gas onto the back surface of the wafer supported by the wafer table to suppress oxidation of the back surface of the wafer. In a state in which the tape of the tape-attached frame is positioned to the back surface of the wafer, the elevating mechanism is actuated to keep the closed state, the spray of the inert gas is stopped, and a vacuum state is generated, and pressure bonding of the tape of the tape-attached frame to the back surface of the wafer is executed by a pressing roller disposed in the upper chamber. Further, preferably, the wafer table includes a heating unit.

The processing apparatus according to the aspect of the present invention is configured as described above. Thus, work of sticking a dicing tape to the back surface of the wafer in which the ring-shaped reinforcing part is formed into the projecting shape on the part of the back surface corresponding to the outer circumferential surplus region to integrate the wafer with the frame is easy. In addition, it is easy to cut the ring-shaped reinforcing part and remove it from the wafer, and the productivity becomes favorable. Further, in the processing apparatus according to the aspect of the present invention, the inert gas is sprayed from the Bernoulli chuck mechanism onto the back surface of the wafer when the wafer carrying-out mechanism carries out the wafer. Therefore, oxidation of the back surface (for example, the back surface coated with a metal film of copper or the like) of the wafer can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described below with reference to the accompanying drawings.

Figure 1:
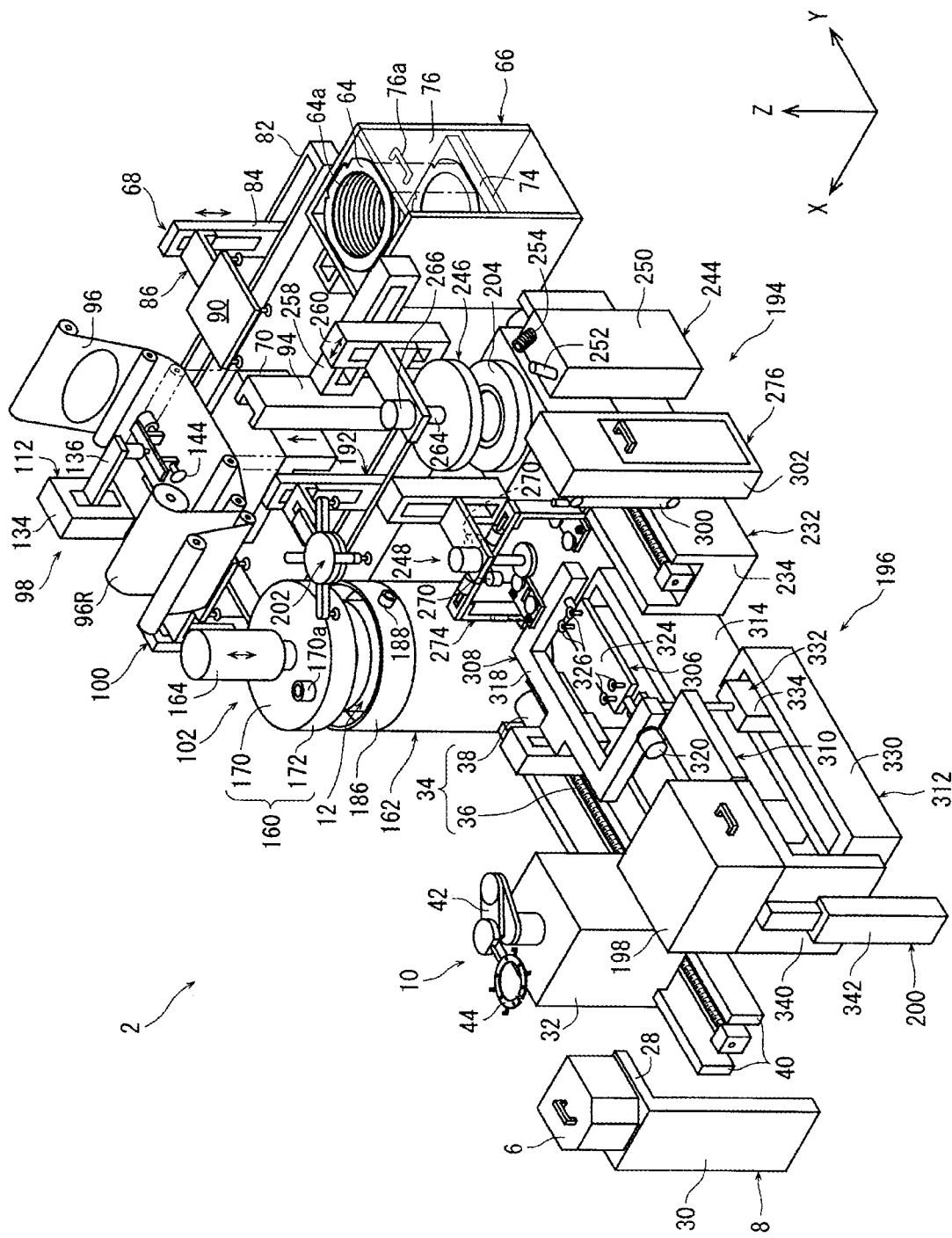
FIG. 1 is a perspective view of a processing apparatus according to an embodiment.

Referring to FIG. 1, a processing apparatus denoted by numeral 2 in whole includes a wafer cassette table 8 on which a wafer cassette 6 in which plural wafers are housed is placed, a wafer carrying-out mechanism 10 that carries out a wafer from the wafer cassette 6 placed on the wafer cassette table 8, and a wafer table 12 that supports the front surface side of the wafer carried out by the wafer carrying-out mechanism 10.

Figure 2:
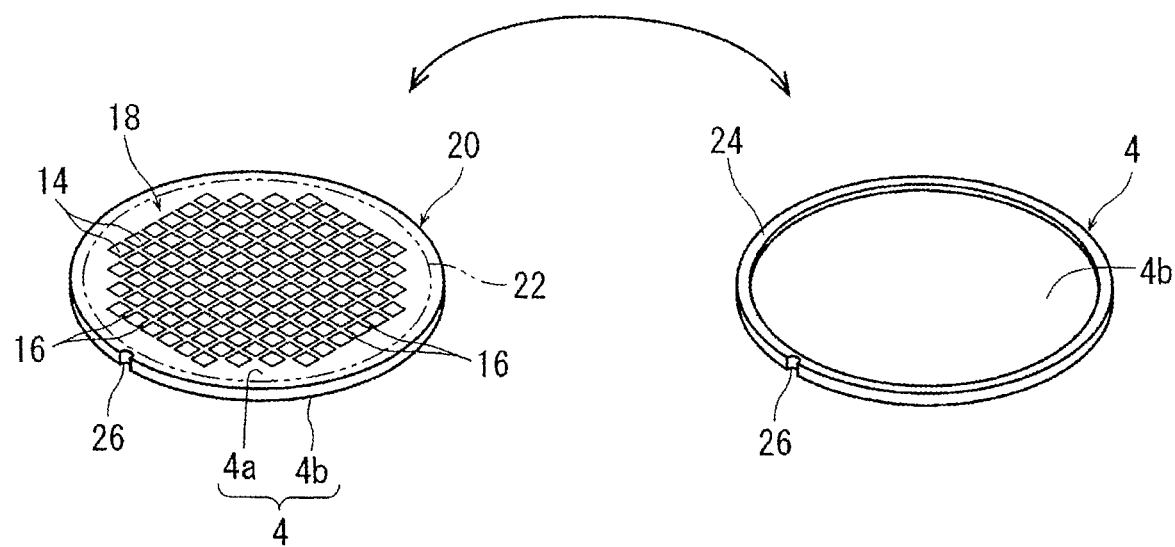
FIG. 2 is a perspective view of a wafer for which processing is executed by the processing apparatus illustrated in FIG. 1.

In FIG. 2, a wafer 4 for which processing is executed by the processing apparatus 2 is illustrated. In a front surface 4a of the wafer 4, a device region 18 in which plural devices 14 such as the IC and the LSI are marked out by planned dividing lines 16 in a lattice manner and an outer circumferential surplus region 20 that surrounds the device region 18 are formed. In FIG. 2, a boundary 22 between the device region 18 and the outer circumferential surplus region 20 is illustrated by a two-dot chain line for convenience. However, in practice, the line that represents the boundary 22 does not exist. A ring-shaped reinforcing part 24 is formed into a projecting shape in the outer circumferential surplus region 20 on the side of a back surface 4b of the wafer 4, and a thickness of the outer circumferential surplus region 20 is larger than that of the device region 18. Further, a notch 26 that represents the crystal orientation is formed at a circumferential edge of the wafer 4.

Figure 3:
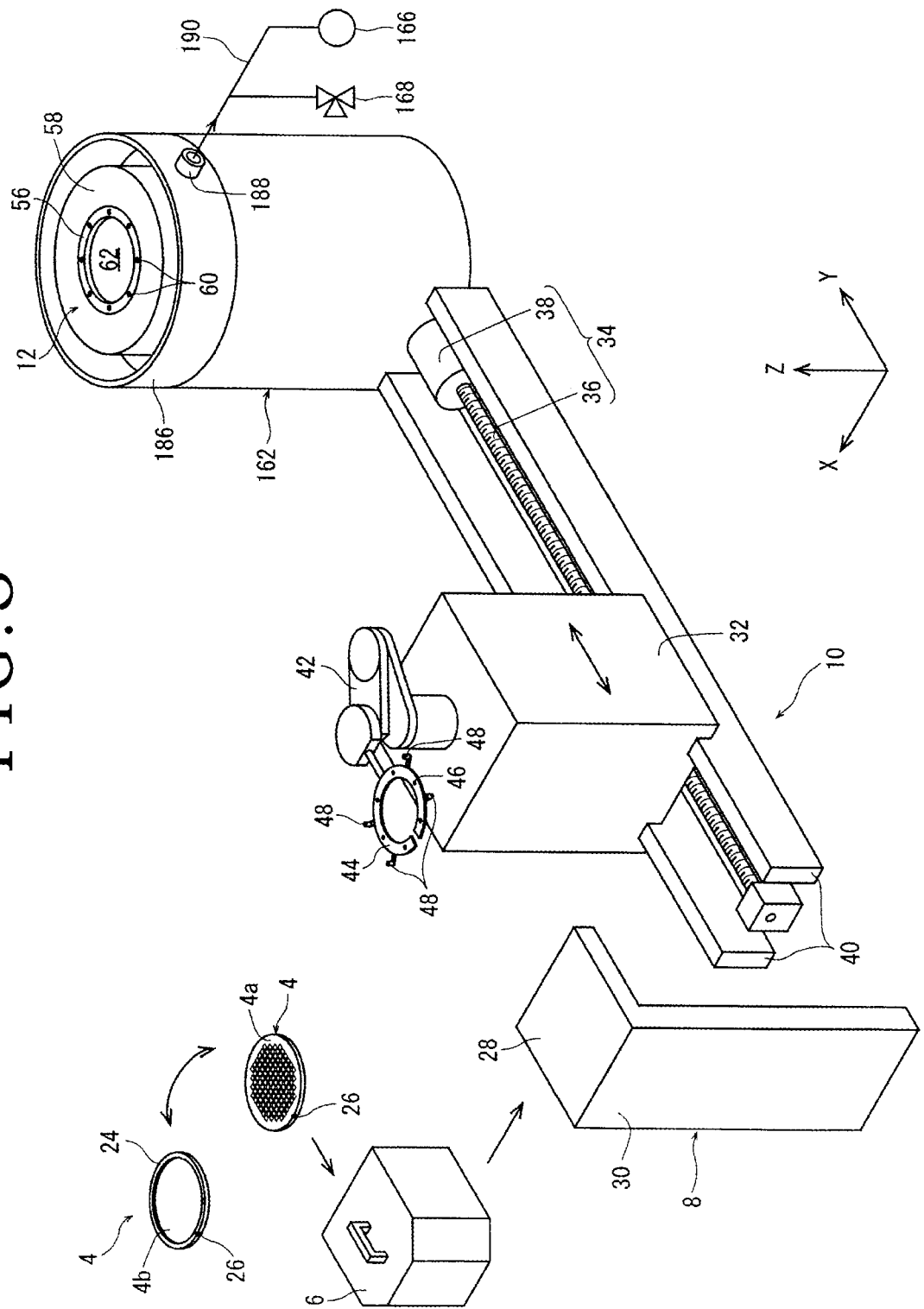
FIG. 3 is a perspective view of a wafer cassette table and so forth illustrated in FIG. 1.

As illustrated in FIG. 3, in the wafer cassette 6, plural wafers 4 are housed at intervals in the upward-downward direction in the state in which the front surfaces 4a are oriented upward. The wafer cassette table 8 of the illustrated embodiment has a top plate 28 on which the wafer cassette 6 is placed and a support plate 30 that supports the top plate 28. The top plate 28 may be capable of rising and lowering and an elevating mechanism that moves up and down the top plate 28 and positions it to a freely selected height may be disposed.

The description will be continued with reference to FIG. 3. The wafer carrying-out mechanism 10 includes a Y-axis movable component 32 that can move in a Y-axis direction illustrated by an arrow Y in FIG. 3 and a Y-axis feed mechanism 34 that moves the Y-axis movable component 32 in the Y-axis direction. The Y-axis feed mechanism 34 has a ball screw 36 that is coupled to a lower end of the Y-axis movable component 32 and extends in the Y-axis direction and a motor 38 that rotates the ball screw 36. The Y-axis feed mechanism 34 converts rotational motion of the motor 38 to linear motion by the ball screw 36 and transmits the linear motion to the Y-axis movable component 32 to move the Y-axis movable component 32 in the Y-axis direction along a pair of guide rails 40 that extend in the Y-axis direction.

An X-axis direction illustrated by an arrow X in FIG. 3 is a direction orthogonal to the Y-axis direction, and a Z-axis direction illustrated by an arrow Z in FIG. 3 is the upward-downward direction orthogonal to the X-axis direction and the Y-axis direction. An XY plane defined by the X-axis direction and the Y-axis direction is substantially horizontal.

As illustrated in FIG. 3, the wafer carrying-out mechanism 10 of the illustrated embodiment includes a conveying arm 42 and a hand 44 that is disposed at the tip of the conveying arm 42 and supports the back surface 4b of the wafer 4 housed in the wafer cassette 6 and inverts the front and back sides of the wafer 4. The conveying arm 42 is disposed on an upper surface of the Y-axis movable component 32 and is driven by an appropriate drive source (not illustrated) such as an air drive source or an electric drive source. This drive source drives the conveying arm 42 and positions the hand 44 to a freely selected position in each direction of the X-axis direction, the Y-axis direction, and the Z-axis direction. In addition, the drive source inverts the hand 44 upside down.

Figure 4:
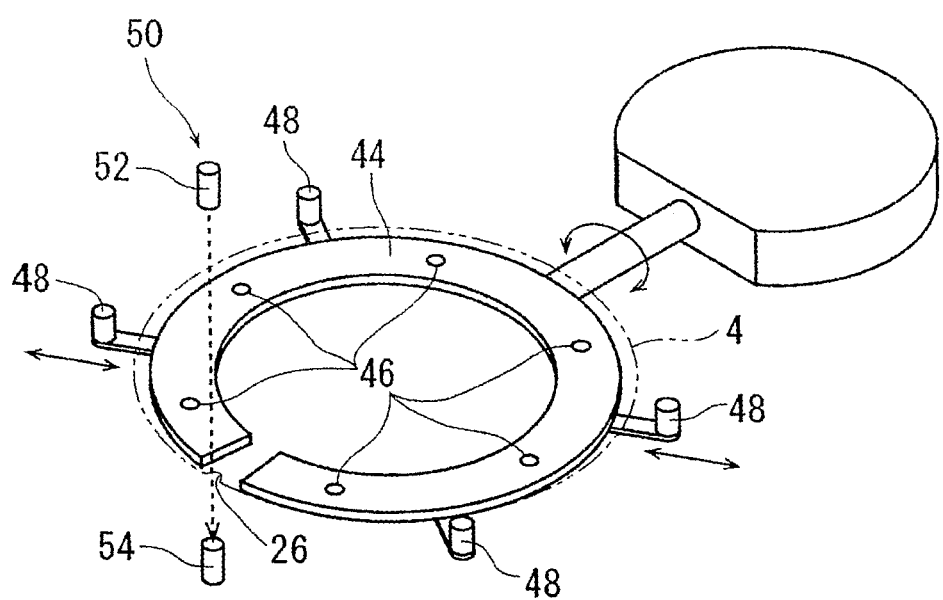
FIG. 4 is a perspective view of a hand illustrated in FIG. 1.

Referring to FIG. 4, the hand 44 is a Bernoulli chuck mechanism that jets inert gas and generates a negative pressure to support the wafer 4 in a contactless manner. The hand 44 of the illustrated embodiment has a C-shape as a whole and plural gas jet ports 46 connected to an inert gas supply source (not illustrated) are formed in a single surface of the hand 44. As the inert gas supplied from the inert gas supply source, besides rare gas such as helium (He) or neon (Ne), nitrogen ($N_2$) can also be used. Plural guide pins 48 are attached to an outer circumferential edge of the hand 44 at intervals in the circumferential direction. Each guide pin 48 is configured to be movable in a radial direction of the hand 44.

As illustrated in FIG. 3 and FIG. 4, after positioning the hand 44 to the side of the back surface 4b (lower side) of the wafer 4 in the wafer cassette 6 placed on the wafer cassette table 8, the wafer carrying-out mechanism 10 jets the inert gas of $N_2$ or the like from the gas jet ports 46 of the hand 44 to the back surface 4b of the wafer 4 to generate a negative pressure on a single surface side of the hand 44 by the Bernoulli effect, and sucks and supports the wafer 4 from the side of the back surface 4b in a contactless manner by the hand 44. Horizontal movement of the wafer 4 sucked and supported by the hand 44 is restricted by the respective guide pins 48.

Then, the wafer carrying-out mechanism 10 carries out the wafer 4 sucked and supported by the hand 44 from the wafer cassette 6 by moving the Y-axis movable component 32 and the conveying arm 42. Moreover, the wafer carrying-out mechanism 10 sprays the inert gas of $N_2$ or the like onto the back surface 4b of the wafer 4 when carrying out the wafer 4, and thus can suppress oxidation of the back surface 4b (for example, the back surface coated with a metal film of copper or the like) of the wafer 4.

As illustrated in FIG. 4, the wafer carrying-out mechanism 10 of the illustrated embodiment includes a notch detecting unit 50 that detects the position of the notch 26 of the wafer 4. For example, the notch detecting unit 50 may include a light emitting element 52 and a light receiving element 54 disposed at an interval from each other in the upward-downward direction and a drive source (not illustrated) that rotates at least one of the guide pins 48 of the hand 44.

The light emitting element 52 and the light receiving element 54 can be attached to the Y-axis movable component 32 or a conveyance route with the interposition of an appropriate bracket (not illustrated). Further, when the guide pin 48 rotates by the above-described drive source, the wafer 4 sucked and supported by the hand 44 rotates due to the rotation of the guide pin 48. It is preferable that an outer circumferential surface of the guide pin 48 that rotates by the drive source be formed of appropriate synthetic rubber in order to surely transmit the rotation from the guide pin 48 to the wafer 4.

The notch detecting unit 50 can detect the position of the notch 26 by rotating the wafer 4 by the drive source through the guide pin 48 in the state in which the wafer 4 is sucked and supported by the hand 44 and an outer circumference of the wafer 4 is positioned between the light emitting element 52 and the light receiving element 54. This makes it possible to adjust the orientation of the wafer 4 to a freely selected orientation.

As illustrated in FIG. 3, the wafer table 12 is disposed adjacent to the wafer carrying-out mechanism 10. The wafer table 12 of the illustrated embodiment includes an annular support part 56 that supports the outer circumferential surplus region 20 of the wafer 4 and causes the part on the inside relative to the outer circumferential surplus region 20 to be contactless and a frame support part 58 that is disposed around an outer circumference of the annular support part 56 and supports a frame 64 (see FIG. 5) to be described later. Plural suction holes 60 disposed at intervals in the circumferential direction are formed in an upper surface of the annular support part 56, and each suction hole 60 is connected to a suction source (not illustrated). The part on the inside in the radial direction relative to the annular support part 56 in the wafer table 12 is a circular recess 62 that is hollow downward. Further, the wafer table 12 of the illustrated embodiment includes a heating unit (not illustrated) such as a heater that heats the wafer 4 placed on the wafer table 12.

When the hand 44 inverts by 180° to invert the front and back sides of the wafer 4 and the wafer 4 is placed on the wafer table 12 in a state in which the front surface 4a of the wafer 4 is oriented downward, the outer circumferential surplus region 20 of the wafer 4 is supported by the annular support part 56, and the device region 18 of the wafer 4 is located in the recess 62. Thus, although the wafer 4 is placed on the wafer table 12 in a state in which the front surface 4a on which the devices 14 are formed is oriented downward, the devices 14 do not get contact with the wafer table 12, and therefore damage to the devices 14 is prevented. Further, the wafer table 12 prevents deviation of the position of the wafer 4 by actuating the suction source and generating a suction force for each suction hole 60 to suck and hold the outer circumferential surplus region 20 after supporting the outer circumferential surplus region 20 by the annular support part 56.

Figure 5:
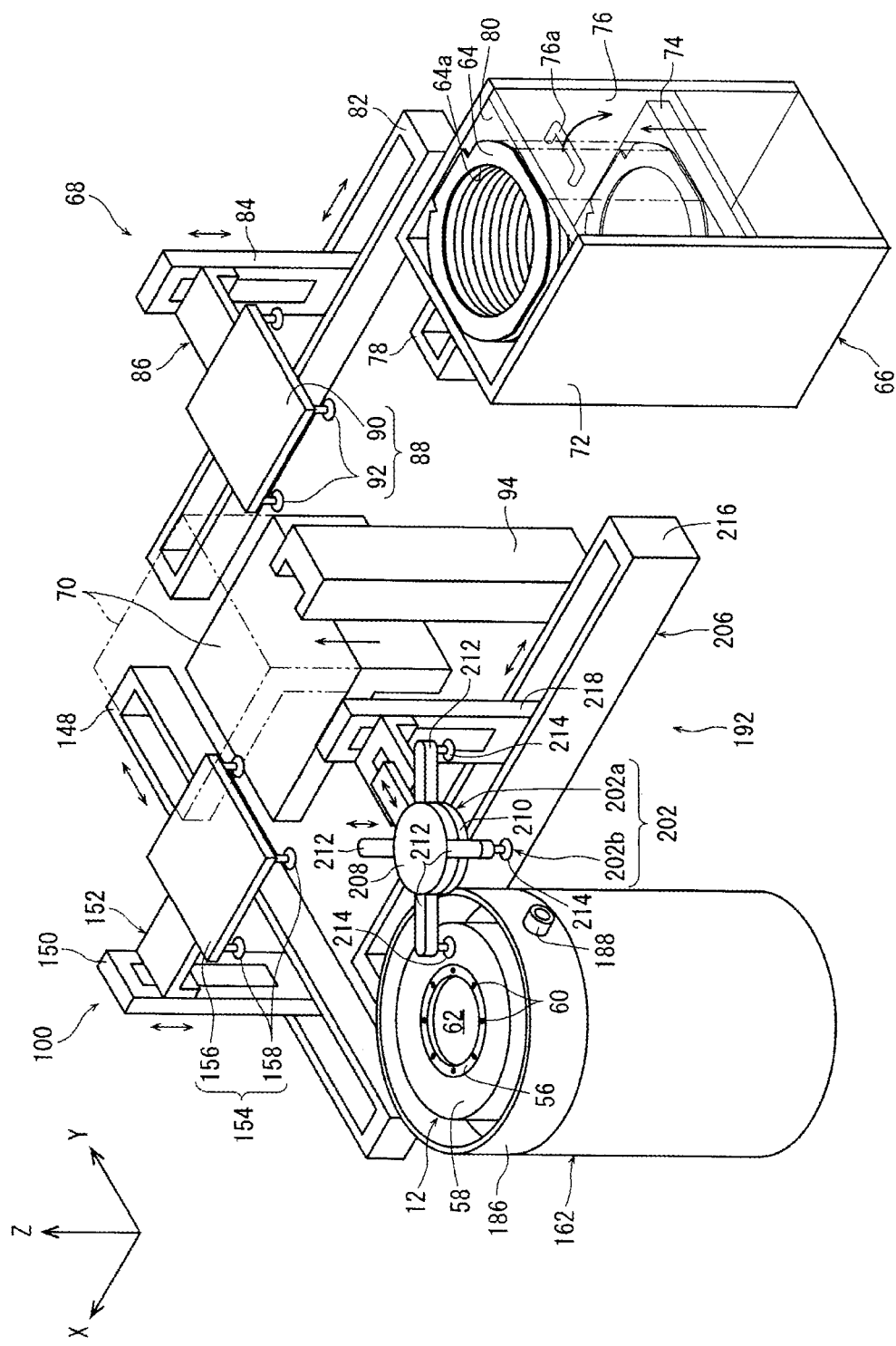
FIG. 5 is a perspective view of a frame housing unit and so forth illustrated in FIG. 1.

Referring to FIG. 5, the processing apparatus 2 further includes a frame housing unit 66 that houses plural ring-shaped frames 64 each of which has an opening part 64a for housing the wafer 4 formed therein, a frame carrying-out mechanism 68 that carries out the frame 64 from the frame housing unit 66, and a frame table 70 that supports the frame 64 carried out by the frame carrying-out mechanism 68.

As illustrated in FIG. 5, the frame housing unit 66 of the illustrated embodiment includes a housing 72, an elevating plate 74 disposed to be capable of moving up and down in the housing 72, and an elevating mechanism (not illustrated) that moves up and down the elevating plate 74.

A Z-axis guide component 78 that extends in the Z-axis direction is disposed on the side surface of the housing 72 on the far side in the X-axis direction in FIG. 5. The elevating plate 74 is supported by the Z-axis guide component 78 in such a manner as to be capable of moving up and down and the elevating mechanism that moves up and down the elevating plate 74 is disposed inside the Z-axis guide component 78. The elevating mechanism may include, for example, a ball screw that is coupled to the elevating plate 74 and extends in the Z-axis direction and a motor that rotates this ball screw.

A door 76 to which a handle 76a is attached is disposed at the side surface of the housing 72 on the near side in the X-axis direction in FIG. 5. In the frame housing unit 66, the frames 64 can be housed inside the housing 72 by grasping the handle 76a and opening the door 76. Further, an opening part 80 is provided at an upper end of the housing 72.

As illustrated in FIG. 5, the frames 64 are housed in such a manner as to be stacked on an upper surface of the elevating plate 74 inside the housing 72. The frame 64 at the uppermost level in the plural frames 64 stacked is carried out from the opening part 80 of the housing 72 by the frame carrying-out mechanism 68. Further, when the frame 64 is carried out from the opening part 80, the frame housing unit 66 moves up the elevating plate 74 as appropriate by the elevating mechanism and positions the frame 64 at the uppermost level to the position from which this frame 64 can be carried out by the frame carrying-out mechanism 68.

The description will be continued with reference to FIG. 5. The frame carrying-out mechanism 68 includes an X-axis guide component 82 that is fixed to an appropriate bracket (not illustrated) and extends in the X-axis direction, an X-axis movable component 84 supported by the X-axis guide component 82 movably in the X-axis direction, an X-axis feed mechanism (not illustrated) that moves the X-axis movable component 84 in the X-axis direction, a Z-axis movable component 86 supported by the X-axis movable component 84 movably in the Z-axis direction, and a Z-axis feed mechanism (not illustrated) that moves the Z-axis movable component 86 in the Z-axis direction.

The X-axis feed mechanism of the frame carrying-out mechanism 68 may include a ball screw that is coupled to the X-axis movable component 84 and extends in the X-axis direction and a motor that rotates this ball screw. The Z-axis feed mechanism may include a ball screw that is coupled to the Z-axis movable component 86 and extends in the Z-axis direction and a motor that rotates this ball screw.

The Z-axis movable component 86 of the frame carrying-out mechanism 68 has a holding part 88 that holds the frame 64. The holding part 88 of the illustrated embodiment has a rectangular holding plate 90 and plural suction pads 92 disposed on a lower surface of the holding plate 90. Each suction pad 92 is connected to a suction source (not illustrated).

The frame carrying-out mechanism 68 sucks and holds the frame 64 at the uppermost level housed in the frame housing unit 66 by the suction pads 92 of the holding part 88 and thereafter moves the X-axis movable component 84 and the Z-axis movable component 86. Accordingly, the frame carrying-out mechanism 68 carries out the sucked and held frame 64 at the uppermost level from the frame housing unit 66.

As illustrated in FIG. 5, the frame table 70 is supported by a Z-axis guide component 94 in such a manner as to be capable of rising and lowering between a lowering position illustrated by solid lines and a rising position illustrated by two-dot chain lines. An appropriate drive source (for example, an air drive source or an electric drive source) that moves up and down the frame table 70 between the lowering position and the rising position is attached to the Z-axis guide component 94. In the frame table 70, the frame 64 carried out by the frame carrying-out mechanism 68 is received at the lowering position.

As illustrated in FIG. 1 and FIG. 5, the processing apparatus 2 includes a tape sticking unit 98 (see FIG. 1) that is disposed above the frame table 70 and sticks a tape 96 to the frame 64, a tape-attached frame conveying mechanism 100 (see FIG. 5) that conveys the frame 64 to which the tape 96 is stuck (hereinafter, often referred to as a "tape-attached frame 64'") to the wafer table 12, positions the opening part 64a of the frame 64 to the back surface 4b of the wafer 4 supported by the wafer table 12, and places the tape-attached frame 64' on the wafer table 12, and a tape pressure bonding unit 102 (see FIG. 1) that executes pressure bonding of the tape 96 of the tape-attached frame 64' to the back surface 4b of the wafer 4.

Figure 6A:
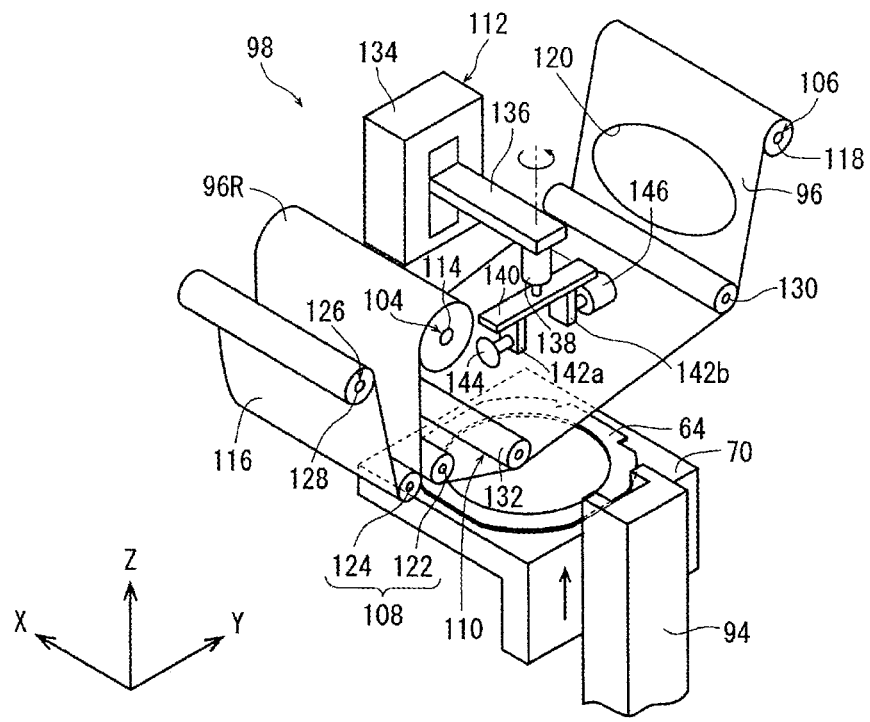
FIG. 6A is a perspective view of a tape sticking unit and so forth in a state in which a frame table illustrated in FIG. 1 is located at a lowering position.
Figure 6B:
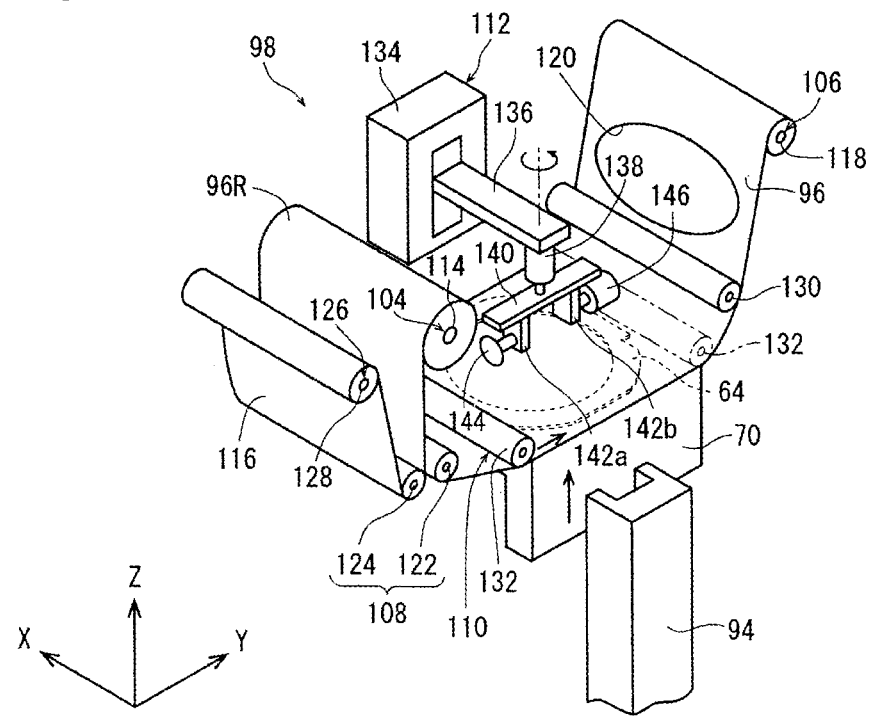
FIG. 6B is a perspective view of the tape sticking unit and so forth in a state in which the frame table illustrated in FIG. 1 is located at a rising position.

Referring to FIG. 6A and FIG. 6B, the tape sticking unit 98 of the illustrated embodiment includes a roll tape support part 104 that supports a roll tape 96R into which the tape 96 before use is wound, a tape take-up part 106 that takes up the used tape 96, a tape pull-out part 108 that pulls out the tape 96 from the roll tape 96R, a pressure bonding part 110 that executes pressure bonding of the pulled-out tape 96 to the frame 64, and a cutting part 112 that cuts the tape 96 protruding to an outer circumference of the frame 64 along the frame 64.

As illustrated in FIG. 6A and FIG. 6B, the roll tape support part 104 includes a support roller 114 supported by an appropriate bracket (not illustrated) rotatably around an axis line that extends in the X-axis direction. By the support roller 114, the roll tape 96R in which release paper 116 for protecting an adhesive surface of the tape 96 is attached to the adhesive surface of the tape 96 and that is wound into a circular cylindrical shape is supported.

The tape take-up part 106 includes a take-up roller 118 supported by an appropriate bracket (not illustrated) rotatably around an axis line that extends in the X-axis direction and a motor (not illustrated) that rotates the take-up roller 118. As illustrated in FIG. 6A and FIG. 6B, the tape take-up part 106 takes up the used tape 96 in which a circular opening part 120 corresponding to the part stuck to the frame 64 is formed by rotating the take-up roller 118 by the motor.

The description will be continued with reference to FIG. 6A and FIG. 6B. The tape pull-out part 108 includes a pull-out roller 122 disposed below the support roller 114 of the roll tape support part 104, a motor (not illustrated) that rotates the pull-out roller 122, and a driven roller 124 that rotates in association with the rotation of the pull-out roller 122. The tape pull-out part 108 pulls out the tape 96 sandwiched by the pull-out roller 122 and the driven roller 124 from the roll tape 96R by rotating the driven roller 124 together with the pull-out roller 122 by the motor.

The release paper 116 is separated from the tape 96 that has passed between the pull-out roller 122 and the driven roller 124, and the separated release paper 116 is taken up by a release paper take-up part 126. The release paper take-up part 126 of the illustrated embodiment has a release paper take-up roller 128 disposed above the driven roller 124, and a motor (not illustrated) that rotates the release paper take-up roller 128. Further, the tape 96 from which the release paper 116 has been separated goes through a guide roller 130 disposed at an interval from the pull-out roller 122 in the Y-axis direction and is guided to the take-up roller 118.

The pressure bonding part 110 includes a pressing roller 132 disposed movably in the Y-axis direction and a Y-axis feed mechanism (not illustrated) that moves the pressing roller 132 in the Y-axis direction. The Y-axis feed mechanism of the pressure bonding part 110 can include an appropriate drive source (for example, an air drive source or an electric drive source).

As illustrated in FIG. 6A and FIG. 6B, the cutting part 112 includes a Z-axis guide component 134 that is fixed to an appropriate bracket (not illustrated) and extends in the Z-axis direction, a Z-axis movable component 136 supported by the Z-axis guide component 134 movably in the Z-axis direction, and a Z-axis feed mechanism (not illustrated) that moves the Z-axis movable component 136 in the Z-axis direction. The Z-axis feed mechanism of the cutting part 112 may include a ball screw that is coupled to the Z-axis movable component 136 and extends in the Z-axis direction and a motor that rotates this ball screw.

Further, the cutting part 112 includes a motor 138 fixed to a lower surface of the tip of the Z-axis movable component 136 and an arm piece 140 rotated by the motor 138 around an axis line that extends in the Z-axis direction. To a lower surface of the arm piece 140, first and second drooping pieces 142*a* and 142*b* are attached at an interval from each other. A circular cutter 144 is supported by the first drooping piece 142*a* rotatably around an axis line orthogonal to the Z-axis direction. A holding-down roller 146 is supported by the second drooping piece 142*b* rotatably around an axis line orthogonal to the Z-axis direction.

The tape sticking unit 98 pulls out the tape 96 that has not been used by the pull-out roller 122 and the driven roller 124 before the frame table 70 that has received the frame 64 from the frame carrying-out mechanism 68 is positioned from the lowering position (the position illustrated in FIG. 6A) to the rising position (the position illustrated in FIG. 6B). Then, the frame table 70 is positioned to the rising position to such an extent that the tape 96 can be pressed against the frame 64 by the pressing roller 132 of the pressure bonding part 110, and the frame 64 is brought into contact with the pressing roller 132 with the interposition of the tape 96.

Then, the pressing roller 132 is rolled in the Y-axis direction while the adhesive surface of the tape 96 is pressed against the frame 64 by the pressing roller 132. This can execute the pressure bonding of the tape 96 pulled out from the roll tape 96R by the tape pull-out part 108 to the frame 64.

The tape 96 may be a thermocompression bonding sheet that does not have an adhesive surface coated by an adhesive or the like. The thermocompression bonding sheet is a sheet made of a thermoplastic synthetic resin (for example, polyolefin-based resin) and is a sheet that softens or melts to exert an adhesive force when being heated to a temperature near the melting point. When the tape 96 is the thermocompression bonding sheet, a heater and a temperature sensor (neither is illustrated) are incorporated in the pressing roller 132, and the temperature of an outer circumferential surface of the pressing roller 132 is adjusted.

Further, after the temperature of the outer circumferential surface of the pressing roller 132 is adjusted to a temperature at which the tape 96 softens or melts, the pressing roller 132 is rolled in the Y-axis direction while the tape 96 is pressed against the frame 64 by the pressing roller 132. Accordingly, thermocompression bonding of the tape 96 to the frame 64 can be executed.

After the tape 96 is pressure-bonded to the frame 64, the tape sticking unit 98 lowers the Z-axis movable component 136 of the cutting part 112 by the Z-axis feed mechanism to press the cutter 144 against the tape 96 on the frame 64 and hold down the frame 64 by the holding-down roller 146 from above the tape 96. Subsequently, the tape sticking unit 98 rotates the arm piece 140 by the motor 138 and causes the cutter 144 and the holding-down roller 146 to move to draw a circle along the frame 64. This can cut the tape 96 that protrudes to the outer circumference of the frame 64 along the frame 64.

Further, because the frame 64 is held down by the holding-down roller 146 from above the tape 96, deviation of the position of the frame 64 and the tape 96 is prevented when the tape 96 is being cut. Then, after the frame table 70 is lowered, the used tape 96 in which the circular opening part 120 corresponding to the part stuck to the frame 64 is formed is taken up by the tape take-up part 106.

As illustrated in FIG. 5, the tape-attached frame conveying mechanism 100 includes a Y-axis guide component 148 that is fixed to an appropriate bracket (not illustrated) and extends in the Y-axis direction, a Y-axis movable component 150 supported by the Y-axis guide component 148 movably in the Y-axis direction, a Y-axis feed mechanism (not illustrated) that moves the Y-axis movable component 150 in the Y-axis direction, a Z-axis movable component 152 supported by the Y-axis movable component 150 movably in the Z-axis direction, and a Z-axis feed mechanism (not illustrated) that moves the Z-axis movable component 152 in the Z-axis direction.

The Y-axis feed mechanism of the tape-attached frame conveying mechanism 100 may include a ball screw that is coupled to the Y-axis movable component 150 and extends in the Y-axis direction and a motor that rotates this ball screw. The Z-axis feed mechanism may include a ball screw that is coupled to the Z-axis movable component 152 and extends in the Z-axis direction and a motor that rotates this ball screw.

The Z-axis movable component 152 of the tape-attached frame conveying mechanism 100 has a holding part 154 that holds the tape-attached frame 64'. The holding part 154 of the illustrated embodiment has a rectangular holding plate 156 and plural suction pads 158 disposed on a lower surface of the holding plate 156. Each suction pad 158 is connected to a suction source (not illustrated).

The tape-attached frame conveying mechanism 100 sucks and holds an upper surface of the tape-attached frame 64' supported by the frame table 70 in a state in which the adhesive surface of the tape 96 is oriented downward by the respective suction pads 158 of the holding part 154 and moves the Y-axis movable component 150 and the Z-axis movable component 152. Accordingly, the tape-attached frame conveying mechanism 100 conveys the tape-attached frame 64' sucked and held by the holding part 154 from the frame table 70 to the wafer table 12, positions the opening part 64*a* of the frame 64 to the back surface 4*b* of the wafer 4 supported by the wafer table 12, and places the tape-attached frame 64' on the wafer table 12.

Figure 7:
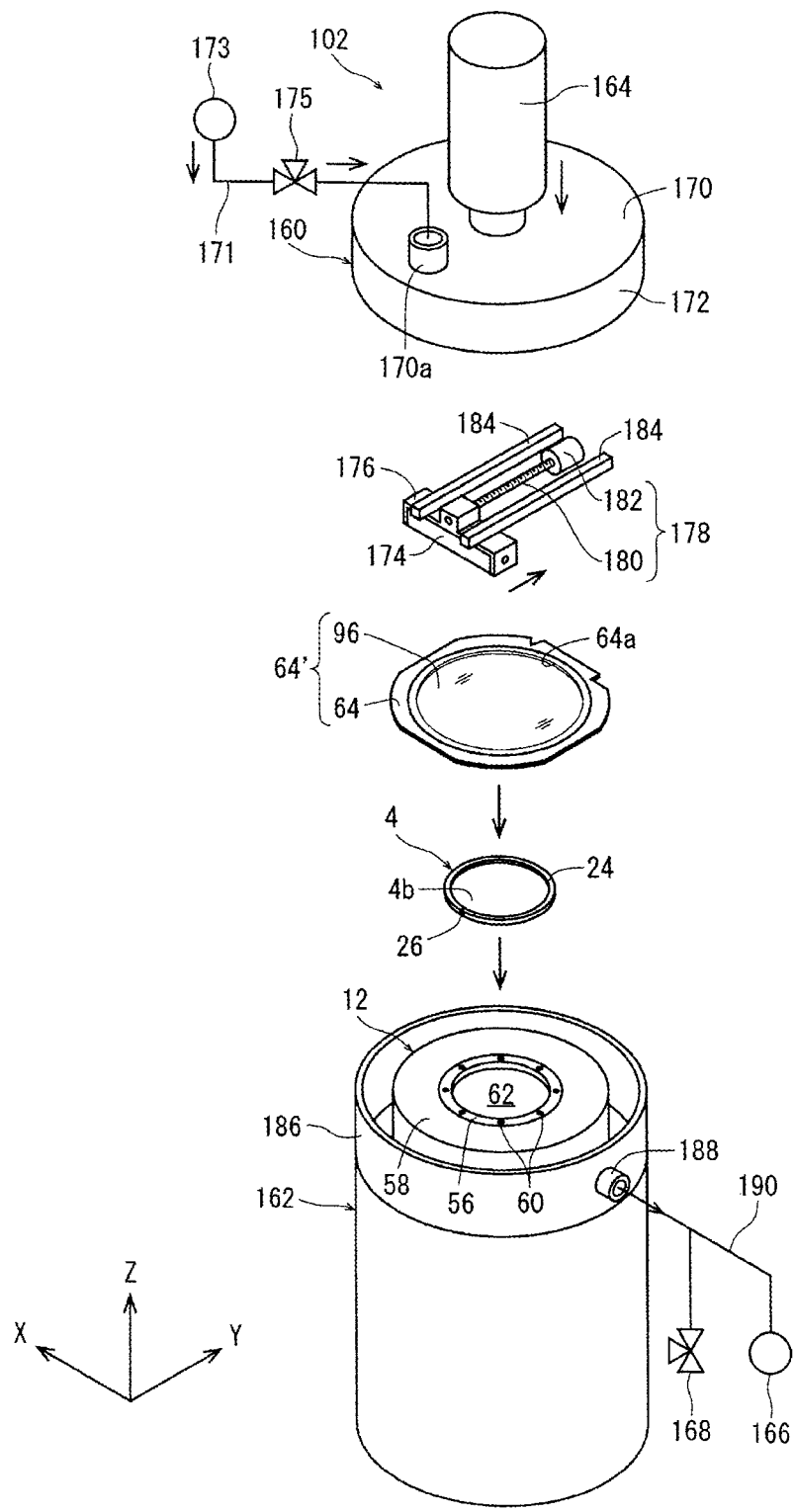
FIG. 7 is an exploded perspective view of a tape pressure bonding unit illustrated in FIG. 1.

The tape pressure bonding unit 102 will be described with reference to FIG. 7 to FIG. 9. As illustrated in FIG. 7, the tape pressure bonding unit 102 includes an upper chamber 160 disposed above the wafer table 12, a lower chamber 162 in which the wafer table 12 is housed, and an elevating mechanism 164 that moves up and down the upper chamber 160 and generates a closed state in which the upper chamber 160 is brought into contact with the lower chamber 162 and an opened state in which the upper chamber 160 is separated from the lower chamber 162. The tape pressure bonding unit 102 further includes a vacuum part 166 that puts the upper chamber 160 and the lower chamber 162 into a vacuum state in the closed state, and an opening-to-atmosphere part 168 that opens the upper chamber 160 and the lower chamber 162 to the atmosphere.

As illustrated in FIG. 7, the upper chamber 160 of the illustrated embodiment includes a circular top plate 170 and a circular cylindrical sidewall 172 that droops from a circumferential edge of the top plate 170. The elevating mechanism 164 that can be configured from an appropriate actuator such as an air cylinder is mounted on an upper surface of the top plate 170.

As illustrated in FIG. 7, a gas supply port 170a for supplying inert gas of $N_2$ or the like to the inside of the upper chamber 160 is provided in the upper surface of the top plate 170. A gas supply source 173 is connected to the gas supply port 170a through a flow path 171, and a valve 175 that opens and closes the flow path 171 is disposed on the flow path 171. Further, the upper chamber 160 sprays the inert gas of $N_2$ or the like supplied from the gas supply source 173 onto the back surface 4b of the wafer 4 supported by the wafer table 12 to suppress oxidation of the back surface 4b of the wafer 4.

In a housing space defined by a lower surface of the top plate 170 and an inner circumferential surface of the sidewall 172, a pressing roller 174 for pressing the tape 96 of the tape-attached frame 64' against the back surface 4b of the wafer 4 supported by the wafer table 12, a support piece 176 that supports the pressing roller 174 rotatably, and a Y-axis feed mechanism 178 that moves the support piece 176 in the Y-axis direction are disposed.

The Y-axis feed mechanism 178 has a ball screw 180 that is coupled to the support piece 176 and extends in the Y-axis direction and a motor 182 that rotates the ball screw 180. Further, the Y-axis feed mechanism 178 converts rotational motion of the motor 182 to linear motion by the ball screw 180 and transmits the linear motion to the support piece 176 to move the support piece 176 along a pair of guide rails 184 that extend in the Y-axis direction.

As illustrated in FIG. 7, the lower chamber 162 has a circular cylindrical sidewall 186. An upper part of the sidewall 186 is opened, and a lower part of the sidewall 186 is closed. A connection opening 188 is formed in the sidewall 186. The vacuum part 166 that can be configured from an appropriate vacuum pump is connected to the connection opening 188 through a flow path 190. The opening-to-atmosphere part 168 that can be configured from an appropriate valve capable of opening the flow path 190 to the atmosphere is disposed on the flow path 190.

When the tape 96 of the tape-attached frame 64' is positioned to the back surface 4b of the wafer 4 supported by the wafer table 12, the tape pressure bonding unit 102 closes the valve 175 to stop the spray of the inert gas, and lowers the upper chamber 160 by the elevating mechanism 164 and brings a lower end of the sidewall 172 of the upper chamber 160 into contact with an upper end of the sidewall 186 of the lower chamber 162 to put the upper chamber 160 and the lower chamber 162 into the closed state. In addition, the tape pressure bonding unit 102 brings the pressing roller 174 into contact with the tape-attached frame 64'.

Subsequently, the tape pressure bonding unit 102 actuates the vacuum pump that configures the vacuum part 166 in a state in which the valve that configures the opening-to-atmosphere part 168 is closed, to put the inside of the upper chamber 160 and the lower chamber 162 into a vacuum state. Thereafter, as illustrated in FIG. 8 and FIG. 9, the tape pressure bonding unit 102 rolls the pressing roller 174 in the Y-axis direction by the Y-axis feed mechanism 178 to thereby execute pressure bonding of the tape 96 to the back surface 4b of the wafer 4 and generate a frame unit U.

When the tape 96 is pressure-bonded to the back surface 4b of the wafer 4 by the pressing roller 174, a slight gap is formed between the wafer 4 and the tape 96 at the root of the ring-shaped reinforcing part 24. However, because the pressure bonding of the wafer 4 and the tape 96 is executed in the state in which the inside of the upper chamber 160 and the lower chamber 162 is put into the vacuum state, the pressure of the slight gap between the wafer 4 and the tape 96 is lower than the atmospheric pressure. Thus, when the opening-to-atmosphere part 168 is opened after the tape 96 is pressure-bonded, the tape 96 is pressed against the wafer 4 by the atmospheric pressure. Due to this, the gap between the wafer 4 and the tape 96 at the root of the reinforcing part 24 disappears, and the tape 96 gets close contact with the back surface 4b of the wafer 4 along the root of the reinforcing part 24.

When the tape 96 is a thermocompression bonding sheet, thermocompression bonding of the tape 96 to the back surface 4b of the wafer 4 can be executed by rolling the pressing roller 174 in the Y-axis direction after heating the wafer 4 to a temperature at which the tape 96 softens or melts by the heating unit of the wafer table 12.

Figure 10:
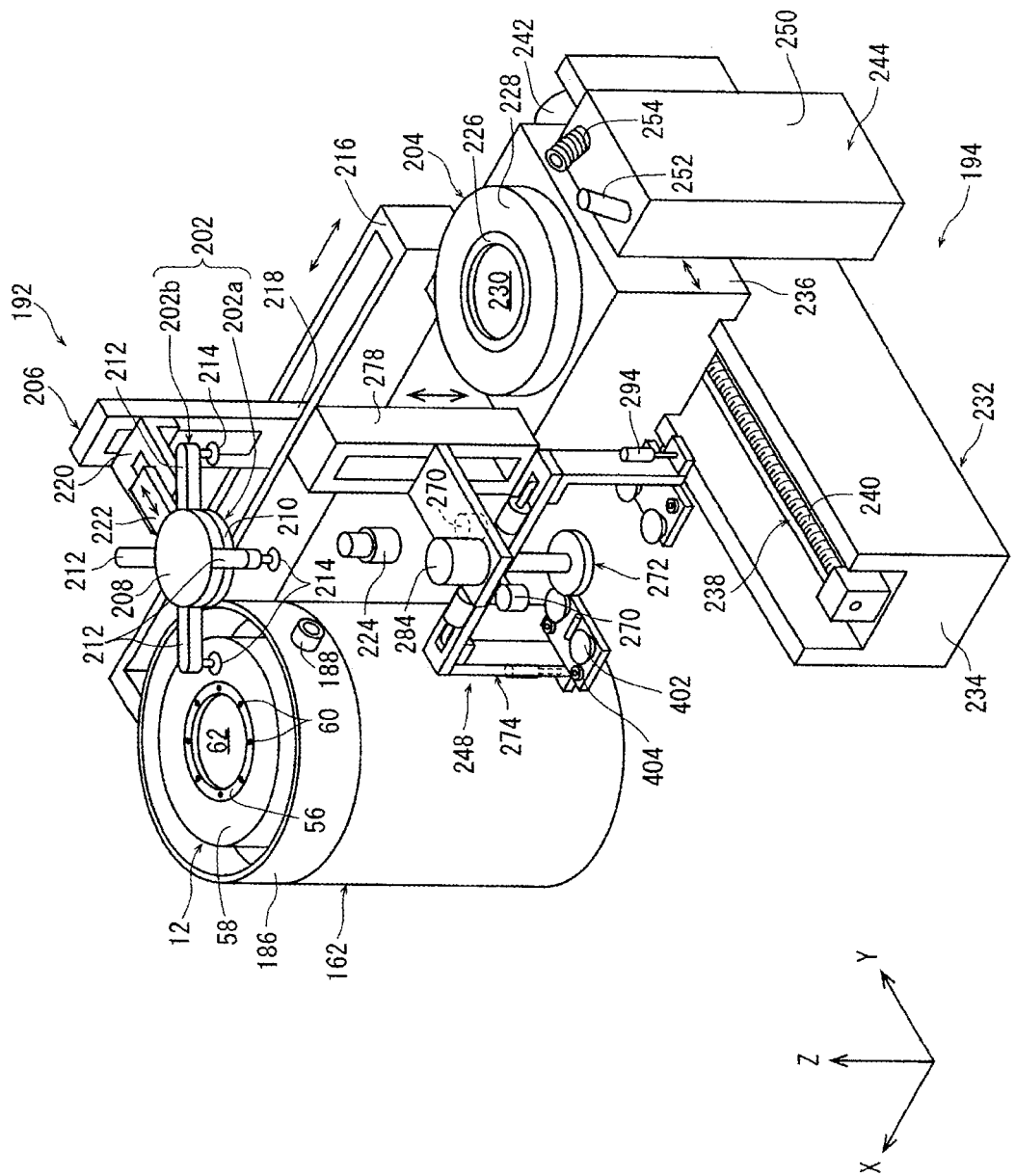
FIG. 10 is a perspective view of a reinforcing part removing unit illustrated in FIG. 1.

As illustrated in FIG. 1 and FIG. 10, the processing apparatus 2 further includes a frame unit carrying-out mechanism 192 that carries out, from the wafer table 12, the frame unit U in which the tape 96 of the tape-attached frame 64' and the back surface 4b of the wafer 4 are pressure-bonded by the tape pressure bonding unit 102 and temporarily places the frame unit U on a temporary placement table 204, and a reinforcing part removing unit 194 that cuts and removes the ring-shaped reinforcing part 24 from the wafer 4 of the frame unit U placed on the temporary placement table 204. The processing apparatus 2 includes also a ring-free unit carrying-out mechanism 196 (see FIG. 1) that carries out the ring-free unit resulting from the removal of the ring-shaped reinforcing part 24 from the reinforcing part removing unit 194 and a frame cassette table 200 (see FIG. 1) on which a frame cassette 198 that houses the ring-free unit carried out by the ring-free unit carrying-out mechanism 196 is placed.

As illustrated in FIG. 10, the frame unit carrying-out mechanism 192 of the illustrated embodiment includes a frame unit holding part 202 including a wafer holding part 202a that holds the wafer 4 and a frame holding part 202b that holds the frame 64 and a conveying part 206 that conveys the frame unit holding part 202 to the temporary placement table 204.

The wafer holding part 202a of the frame unit holding part 202 includes a circular holding plate 208 and a circular suction piece 210 mounted on a lower surface of the holding plate 208. Plural suction holes (not illustrated) are formed in a lower surface of the suction piece 210, and each suction hole is connected to a suction source (not illustrated). The frame holding part 202b includes plural (in the illustrated embodiment, four) protruding pieces 212 that protrude outward in the radial direction from a circumferential edge of the holding plate 208 of the wafer holding part 202a with the interposition of intervals in the circumferential direction, and suction pads 214 attached to lower surfaces of the protruding pieces 212. Each suction pad 214 is connected to the suction source (not illustrated).

The conveying part 206 includes an X-axis guide component 216 that is fixed to an appropriate bracket (not illustrated) and extends in the X-axis direction, an X-axis movable component 218 supported by the X-axis guide component 216 movably in the X-axis direction, and an X-axis feed mechanism (not illustrated) that moves the X-axis movable component 218 in the X-axis direction. The conveying part 206 further includes a Z-axis movable component 220 supported by the X-axis movable component 218 movably in the Z-axis direction, a Z-axis feed mechanism (not illustrated) that moves the Z-axis movable component 220 in the Z-axis direction, a Y-axis movable component 222 supported by the Z-axis movable component 220 movably in the Y-axis direction, and a Y-axis feed mechanism (not illustrated) that moves the Y-axis movable component 222 in the Y-axis direction. The holding plate 208 of the wafer holding part 202a is coupled to the tip of the Y-axis movable component 222. Each of the X-axis, Y-axis, and Z-axis feed mechanisms of the conveying part 206 may include a ball screw and a motor that rotates the ball screw.

It is preferable for the frame unit carrying-out mechanism 192 to include a two-dimensional movement mechanism that two-dimensionally moves the frame unit holding part 202 in the horizontal direction and an imaging part 224 that images the outer circumference of the wafer 4 of the frame unit U held by the frame unit holding part 202. In the illustrated embodiment, the frame unit holding part 202 two-dimensionally moves in the horizontal direction in the XY plane by the X-axis feed mechanism and the Y-axis feed mechanism of the conveying part 206, and the two-dimensional movement mechanism is configured by the conveying part 206. Further, the imaging part 224 of the illustrated embodiment is disposed between the wafer table 12 and the temporary placement table 204, and the outer circumference of the wafer 4 of the frame unit U held by the frame unit holding part 202 is imaged from the lower side of the wafer 4.

The frame unit carrying-out mechanism 192 actuates the conveying part 206 in a state in which the wafer 4 is sucked and held from the side of the back surface 4b (side of the tape 96) by the suction piece 210 of the wafer holding part 202a and the frame 64 is sucked and held by the suction pads 214 of the frame holding part 202b. Accordingly, the frame unit carrying-out mechanism 192 carries out the frame unit U held by the frame unit holding part 202 from the wafer table 12.

Further, the frame unit carrying-out mechanism 192 of the illustrated embodiment measures the coordinates of at least three points at the outer circumference of the wafer 4 by actuating the conveying part 206 that configures the two-dimensional movement mechanism and imaging, by the imaging part 224, at least three places at the outer circumference of the wafer 4 of the frame unit U held by the frame unit holding part 202, and obtains the center coordinates of the wafer 4 on the basis of the measured coordinates of the three points. Then, the frame unit carrying-out mechanism 192 makes the center of the wafer 4 correspond with the center of the temporary placement table 204 and temporarily places the frame unit U on the temporary placement table 204.

As illustrated in FIG. 10, the temporary placement table 204 is disposed at an interval from the wafer table 12 in the X-axis direction. The temporary placement table 204 of the illustrated embodiment includes an annular support part 226 that supports the outer circumferential surplus region 20 of the wafer 4 of the frame unit U and causes the part on the inside relative to the outer circumferential surplus region 20 to be contactless, and a frame support part 228 that is disposed around an outer circumference of the annular support part 226 and supports the frame 64.

The part on the inside in the radial direction relative to the annular support part 226 is a circular recess 230 that is hollow downward. It is preferable that the frame support part 228 of the temporary placement table 204 include a heater (not illustrated) and the tape 96 be softened by heating the tape 96 of the frame unit U temporarily placed on the temporary placement table 204 by the heater and the tape 96 be brought into closer contact with the root of the ring-shaped reinforcing part 24 by the atmospheric pressure.

The processing apparatus 2 of the illustrated embodiment includes a temporary placement table conveying part 232 that conveys the temporary placement table 204 in the Y-axis direction. The temporary placement table conveying part 232 includes a Y-axis guide component 234 that extends in the Y-axis direction, a Y-axis movable component 236 supported by the Y-axis guide component 234 movably in the Y-axis direction, and a Y-axis feed mechanism 238 that moves the Y-axis movable component 236 in the Y-axis direction. The temporary placement table 204 is fixed to the upper part of the Y-axis movable component 236. The Y-axis feed mechanism 238 has a ball screw 240 that is coupled to the Y-axis movable component 236 and extends in the Y-axis direction, and a motor 242 that rotates the ball screw 240. Further, the temporary placement table conveying part 232 converts rotational motion of the motor 242 to linear motion by the ball screw 240 and transmits the linear motion to the Y-axis movable component 236 to convey the temporary placement table 204 in the Y-axis direction together with the Y-axis movable component 236.

As illustrated in FIG. 1 and FIG. 10, the reinforcing part removing unit 194 includes a laser beam irradiation unit 244 that irradiates the root of the ring-shaped reinforcing part 24 formed at the outer circumference of the wafer 4 with a laser beam to form a cut groove, a first elevating table 246 (see FIG. 1) that holds and raises the frame unit U temporarily placed on the temporary placement table 204 and moves in the X-axis direction to position the frame unit U to the laser beam irradiation unit 244, and a separating part 248 that separates the ring-shaped reinforcing part 24 from the cut groove.

As illustrated in FIG. 10, the laser beam irradiation unit 244 includes a housing 250 disposed adjacent to the temporary placement table 204 in the X-axis direction, a laser oscillator (not illustrated) that is housed in the housing 250 and generates a laser beam, and a light collector 252 that focuses the laser beam generated by the laser oscillator and irradiates the root of the ring-shaped reinforcing part 24 formed at the outer circumference of the wafer 4 with the laser beam. The laser beam irradiation unit 244 further includes a suction nozzle 254 that sucks debris generated when the wafer 4 is irradiated with the laser beam, and a suction source (not illustrated) connected to the suction nozzle 254.

The light collector 252 extends upward from an upper surface of the housing 250 with an inclination toward the side of the suction nozzle 254. Due to this, dropping of debris generated in the irradiation with the laser beam onto the light collector 252 is suppressed. Further, the suction nozzle 254 extends upward from the upper surface of the housing 250 with an inclination toward the side of the light collector 252.

Figure 11:
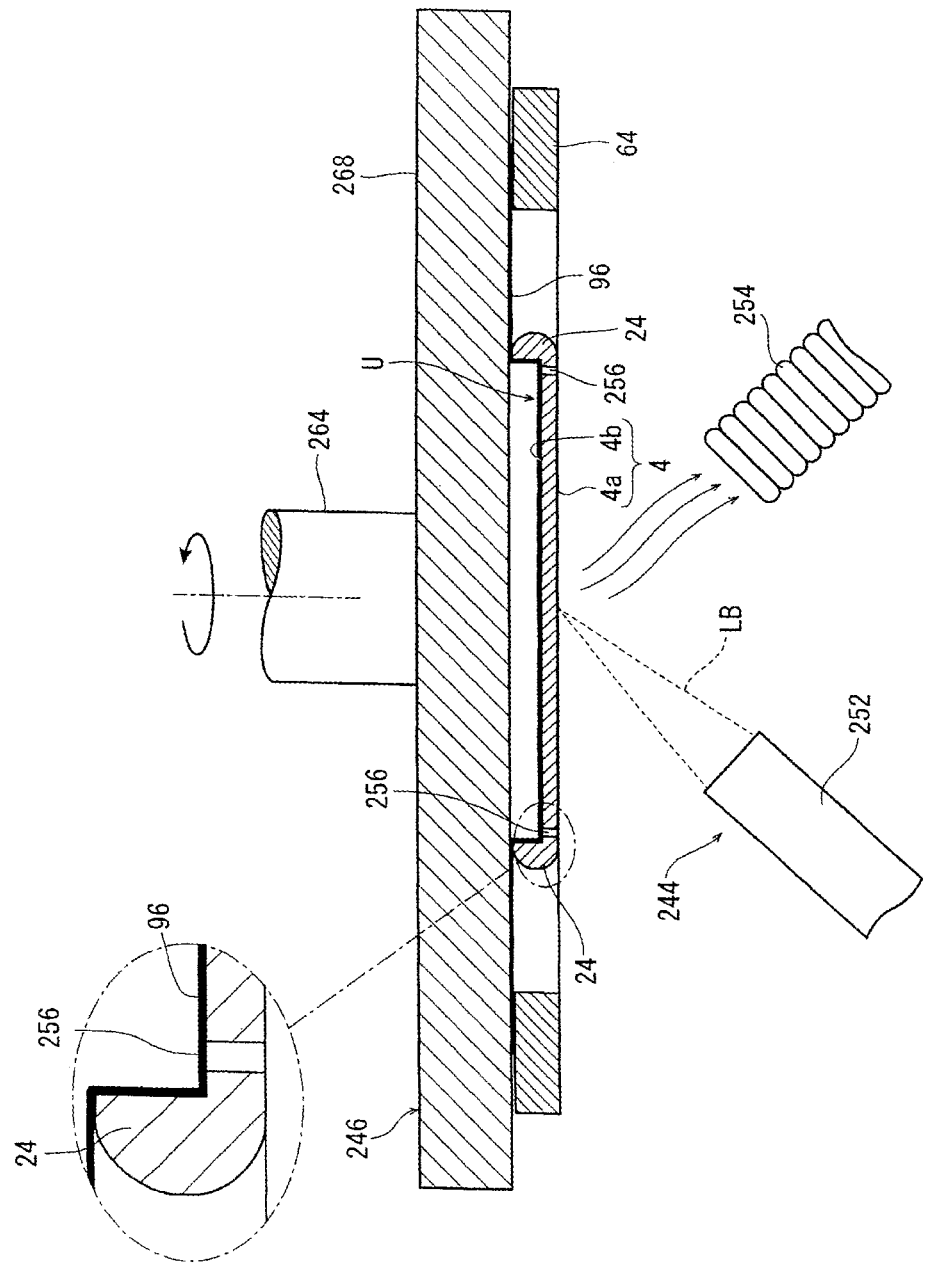
FIG. 11 is a schematic diagram illustrating the state in which a root of a ring-shaped reinforcing part of the wafer is being irradiated with a laser beam in a reinforcing part removal step.

As illustrated in FIG. 11, the laser beam irradiation unit 244 irradiates the root of the ring-shaped reinforcing part 24 formed at the outer circumference of the wafer 4 with a laser beam LB while rotating the frame unit U held by the first elevating table 246, to form a ring-shaped cut groove 256 along the root of the reinforcing part 24 by ablation processing. Moreover, the laser beam irradiation unit 244 sucks debris generated due to the ablation processing by the suction nozzle 254.

Figure 12:
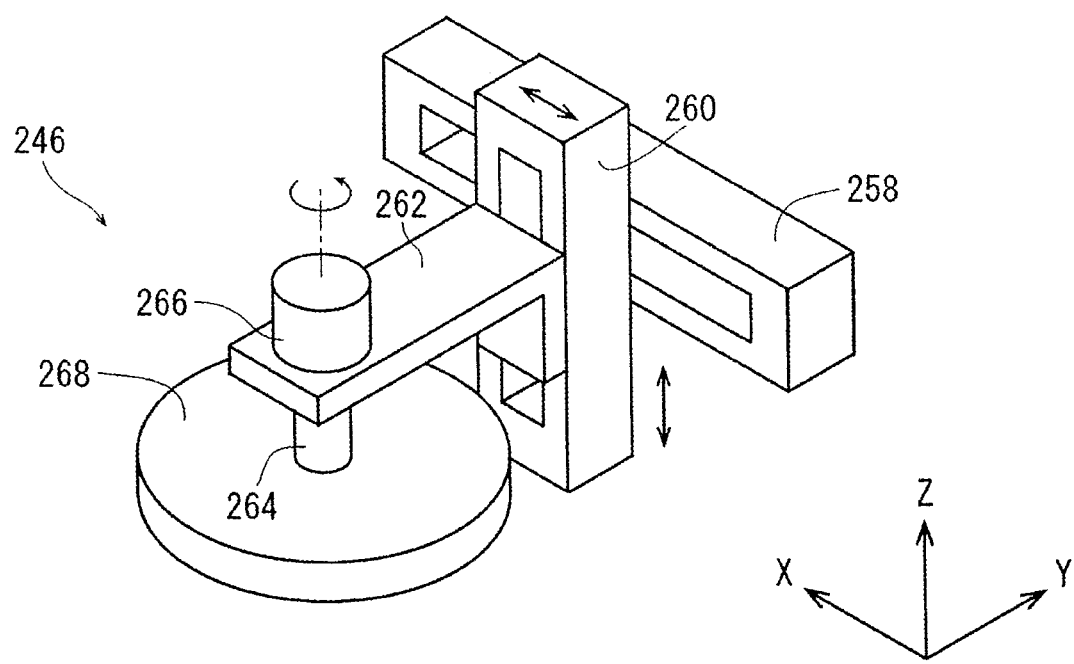
FIG. 12 is a perspective view of a first elevating table of the reinforcing part removing unit illustrated in FIG. 1.

As illustrated in FIG. 1, the first elevating table 246 is disposed above the temporary placement table 204 movably in the X-axis direction and movably in the Z-axis direction. Referring to FIG. 12, the first elevating table 246 includes an X-axis guide component 258 that is fixed to an appropriate bracket (not illustrated) and extends in the X-axis direction, an X-axis movable component 260 supported by the X-axis guide component 258 movably in the X-axis direction, an X-axis feed mechanism (not illustrated) that moves the X-axis movable component 260 in the X-axis direction, a Z-axis movable component 262 supported by the X-axis movable component 260 movably in the Z-axis direction, and a Z-axis feed mechanism (not illustrated) that moves the Z-axis movable component 262 in the Z-axis direction. Each of the X-axis and Z-axis feed mechanisms of the first elevating table 246 may include a ball screw and a motor that rotates the ball screw.

A support shaft 264 that extends downward is rotatably supported by a lower surface of the tip of the Z-axis movable component 262. A motor 266 that rotates the support shaft 264 around an axis line extending in the Z-axis direction is attached to an upper surface of the tip of the Z-axis movable component 262. A circular suction piece 268 is fixed to a lower end of the support shaft 264. In a lower surface of the suction piece 268, plural suction holes (not illustrated) are formed on a circumference corresponding to the size of the frame 64 at intervals in the circumferential direction. Each suction hole is connected to a suction source.

The first elevating table 246 sucks and holds, by the suction piece 268, the part of the frame 64 of the frame unit U in which the tape 96 has been heated by the heater of the frame support part 228 of the temporary placement table 204 and the tape 96 is in close contact with the root of the ring-shaped reinforcing part 24. Thereafter, the first elevating table 246 moves the Z-axis movable component 262 and the X-axis movable component 260 to raise the frame unit U sucked and held by the suction piece 268 and move the frame unit U in the X-axis direction and position it to the laser beam irradiation unit 244. When the frame 64 is formed of a material having magnetism, an electromagnet (not illustrated) may be attached to the lower surface of the suction piece 268 and the suction piece 268 may suck the frame 64 by a magnetic force to be attached thereto.

Further, when the wafer 4 is irradiated with the laser beam LB by the laser beam irradiation unit 244, the first elevating table 246 actuates the motor 266 to rotate the frame unit U sucked and held by the suction piece 268. Moreover, the first elevating table 246 moves the frame unit U in which the cut groove 256 is formed at the root of the reinforcing part 24 in the X-axis direction and the Z-axis direction and temporarily places it on the temporary placement table 204.

Figure 13A:
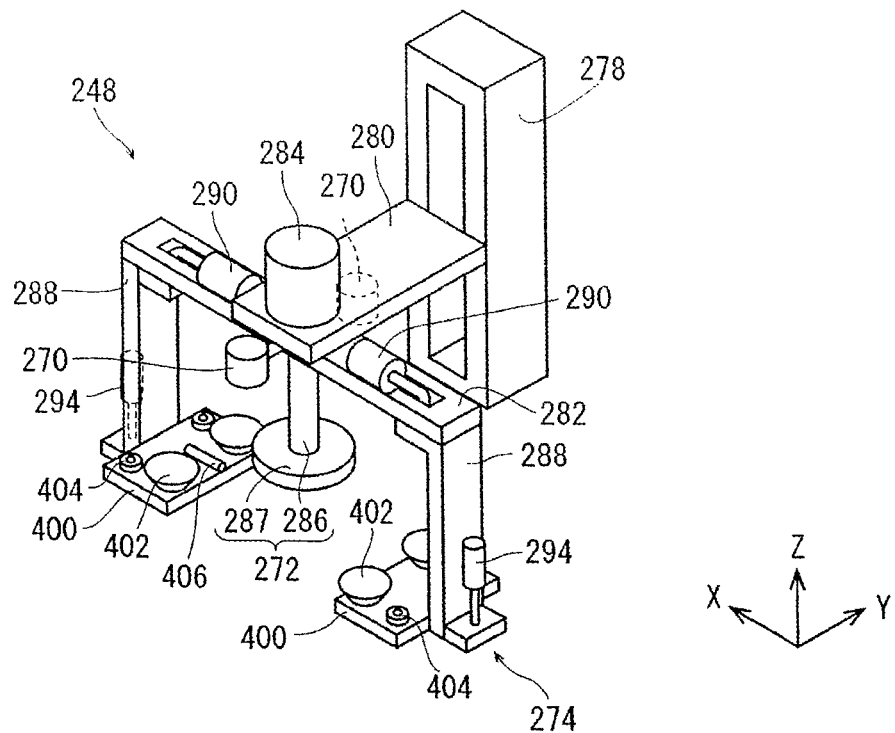
FIG. 13A is a perspective view of a separating part of the reinforcing part removing unit illustrated in FIG. 1.
Figure 13B:
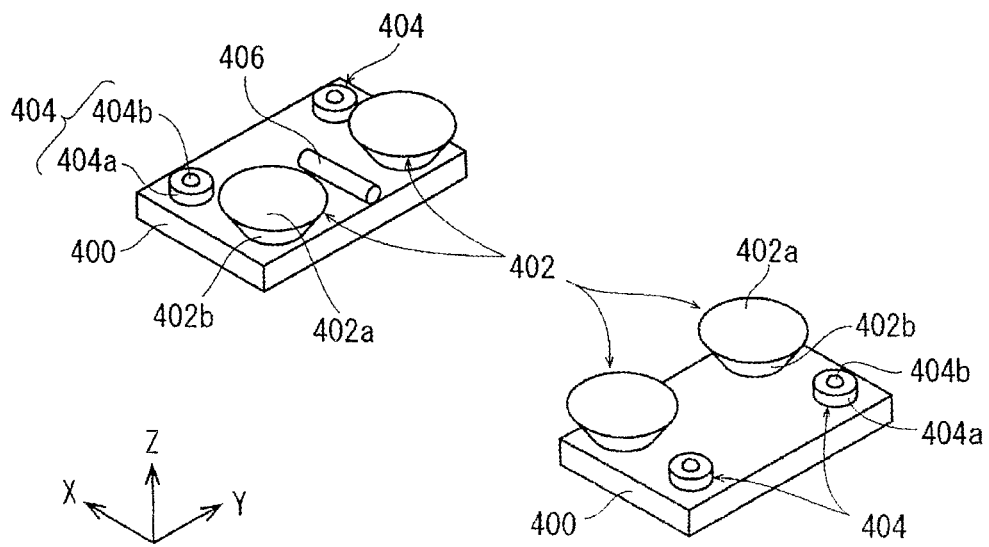
FIG. 13B is an enlarged perspective view of support substrates illustrated in FIG. 13A.
Figure 14:
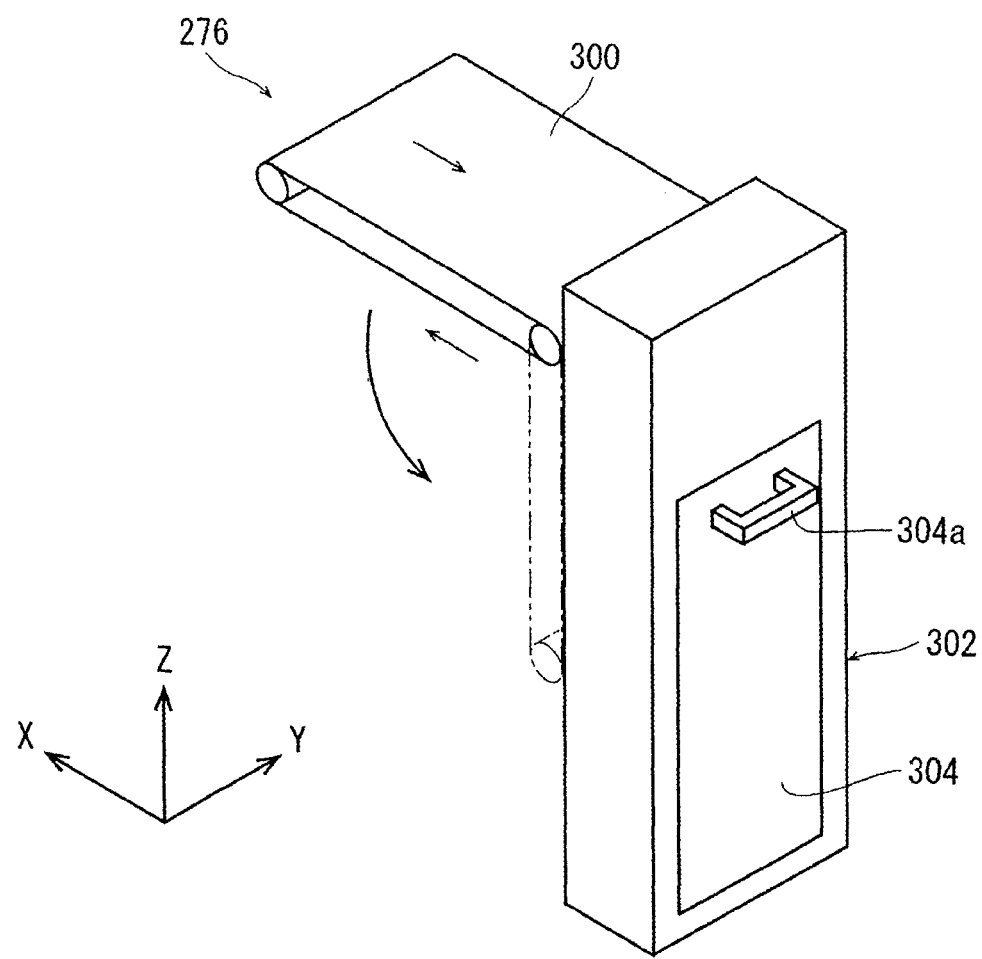
FIG. 14 is a perspective view of a discard part of the reinforcing part removing unit illustrated in FIG. 1.

As illustrated in FIG. 1, the separating part 248 is disposed at an interval from the first elevating table 246 in the Y-axis direction in the movable range of the temporary placement table 204 in the Y-axis direction. Referring to FIG. 13A, FIG. 13B, and FIG. 14, the separating part 248 includes ultraviolet irradiation parts 270 (see FIG. 13A) that irradiate the tape 96 corresponding to the cut groove 256 with ultraviolet to reduce the adhesive force of the tape 96, and a second elevating table 272 (see FIG. 13A) that sucks and holds the inside of the wafer 4 in such a manner that the ring-shaped reinforcing part 24 is exposed to the outer circumference. The separating part 248 further includes a separator 274 (see FIG. 13A) that causes tops 402 each having a wedge to act on the outer circumference of the ring-shaped reinforcing part 24 and separates the ring-shaped reinforcing part 24 and a discard part 276 (see FIG. 14) by which the separated ring-shaped reinforcing part 24 is discarded.

As illustrated in FIG. 13A, the separating part 248 of the illustrated embodiment includes a Z-axis guide component 278 that is fixed to an appropriate bracket (not illustrated) and extends in the Z-axis direction, a Z-axis movable component 280 supported by the Z-axis guide component 278 movably in the Z-axis direction, and a elevating mechanism (not illustrated) that moves the Z-axis movable component 280 in the Z-axis direction. The elevating mechanism may include a ball screw that is coupled to the Z-axis movable component 280 and extends in the Z-axis direction, and a motor that rotates this ball screw.

A support piece 282 is supported by a lower surface of the tip of the Z-axis movable component 280, and the second elevating table 272 is rotatably supported by the lower surface of the tip of the Z-axis movable component 280. A motor 284 that rotates the second elevating table 272 is attached to an upper surface of the tip of the Z-axis movable component 280. A pair of the above-described ultraviolet irradiation parts 270 are attached to the support piece 282 of the illustrated embodiment at an interval in the Y-axis direction.

The second elevating table 272 has a support shaft 286 that extends downward from the lower surface of the tip of the Z-axis movable component 280 and a circular table head 287 attachably-detachably mounted on a lower end of the support shaft 286. Plural suction holes (not illustrated) are formed in a lower surface of the table head 287, and each suction hole is connected to a suction source.

The table head 287 has an outer diameter corresponding to the inner diameter of the reinforcing part 24 of the wafer 4. Specifically, the diameter of the table head 287 is slightly smaller than that of the device region 18 of the wafer 4. Further, the table head 287 is attachably-detachably mounted on the support shaft 286 and can be replaced according to the diameter of the wafer 4. The support shaft 286 on which the table head 287 is mounted is connected to the elevating mechanism of the separating part 248 through the Z-axis movable component 280. As above, the second elevating table 272 includes two or more kinds of table head 287 having an outer diameter corresponding to the inner diameter of the reinforcing part 24 of the wafer 4, and the table head 287 is attachably-detachably mounted to the elevating mechanism of the separating part 248.

Further, the above-described separator 274 is mounted on the support piece 282. The separator 274 includes a pair of movable pieces 288 disposed on a lower surface of the support piece 282 at an interval movably in the longitudinal direction of the support piece 282, a pair of feed mechanisms 290 that move the pair of movable pieces 288, a pair of support plates 400 supported by the respective movable pieces 288 in such a manner as to be capable of moving upward and downward, and a pair of Z-axis feed mechanisms 294 that move up and down the pair of support plates 400 in the Z-axis direction. Each of the pairs of feed mechanisms 290 and Z-axis feed mechanisms 294 can be configured from an appropriate actuator such as an air cylinder or an electric cylinder.

The description will be continued with reference to FIG. 13A and FIG. 13B. On an upper surface of each support plate 400, the tops 402 having the wedges, frame support parts 404 that support the frame 64, and an ionizer 406 that removes static electricity from the frame unit U are mounted.

The tops 402 have an inverted truncated cone shape in which the diameter gradually decreases from the upper side toward the lower side, and the wedge is configured by an upper surface 402a of the top 402 and a side surface 402b of the top 402. A pair of tops 402 are disposed on the upper surface of each support plate 400 at an interval from each other and are supported by the support plate 400 rotatably around an axis line that extends in the Z-axis direction.

A pair of frame support parts 404 are disposed adjacent to the tops 402 on the upper surface of each of the support plates 400. The frame support parts 404 have a housing 404a fixed to the support plate 400 and a sphere 404b rotatably supported by the housing 404a. In the frame support parts 404, the frame 64 is supported by the respective spheres 404b.

The ionizer 406 is disposed adjacent to the tops 402. The ionizer 406 removes static electricity from the frame unit U by blowing ionized air toward the frame unit U.

The separating part 248 of the illustrated embodiment includes a detector (not illustrated) that detects whether or not the kind of table head 287 input to a control unit (not illustrated) that controls actuation of the processing apparatus 2 corresponds with the kind of table head 287 actually mounted in the processing apparatus 2.

The control unit is configured from a computer having a central processing unit (CPU) that executes calculation processing according to a control program, a read only memory (ROM) that stores the control program and so forth, and a readable-writable random access memory (RAN) that stores a calculation result and so forth. Processing conditions such as the diameter of the wafer 4, the width of the reinforcing part 24, and the outer diameter of the table head 287 are input to the control unit by an operator.

Figure 15:
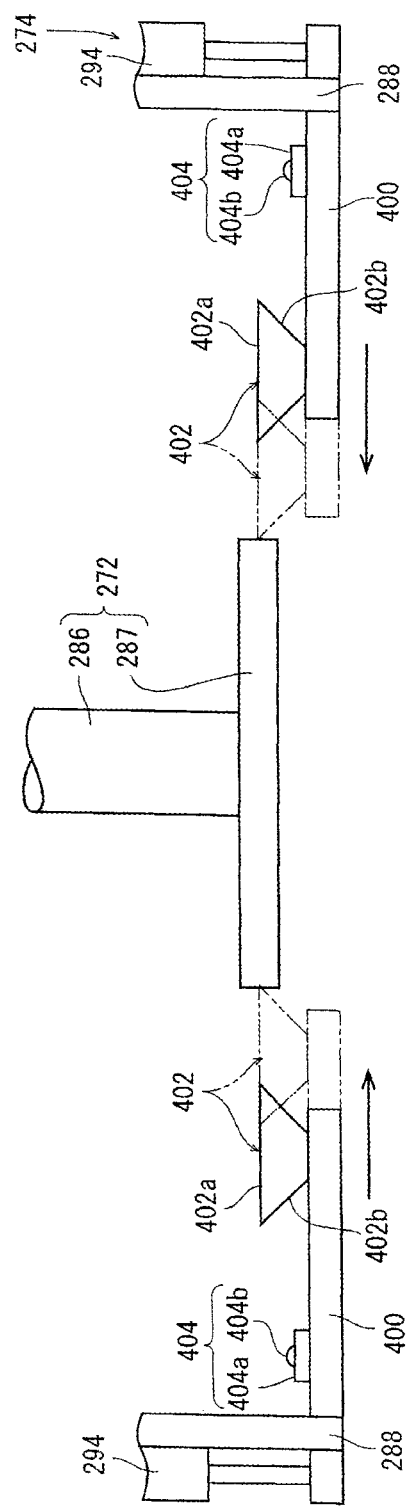
FIG. 15 is a schematic diagram illustrating a state in which tops are brought into contact with a table head illustrated in FIG. 1 and an outer diameter of the table head is detected.

The detector of the illustrated embodiment includes the tops 402 of the separator 274 and the feed mechanisms 290 that cause the tops 402 to get closer to and get further away from the table head 287 by actuating the movable pieces 288. Further, in the detector, before processing of the wafer 4 is started, the movable pieces 288 are actuated by the feed mechanisms 290 and, as illustrated in FIG. 15, whether or not the outer diameter of the table head 287 obtained through bringing the tops 402 of the separator 274 into contact with an outer circumference of the table head 287 corresponds with the outer diameter of the table head 287 input to the control unit is detected. When it is detected by the detector that both do not correspond with each other, an error notification (for example, display indicating the non-correspondence on a control panel (not illustrated)) is made.

Even when the diameter of the wafer 4 is the same, for example, 200 mm, the width of the ring-shaped reinforcing part 24 is different, for example, 3 mm, 5 mm, and so forth, in some cases. Thus, the table head 287 corresponding to the device region 18 of the wafer 4 needs to be mounted in the processing apparatus 2. If the kind of table head 287 input to the control unit does not correspond with the kind of table head 287 actually mounted, it becomes impossible to properly remove the ring-shaped reinforcing part 24 from the wafer 4.

Regarding this point, in the processing apparatus 2 of the illustrated embodiment, the detector that detects whether or not the kind of table head 287 input to the control unit corresponds with the kind of table head 287 actually mounted in the processing apparatus 2 is included. Hence, whether or not the proper table head 287 corresponding to the wafer 4 is mounted can be checked before processing of the wafer 4 is started, and the ring-shaped reinforcing part 24 can properly be removed from the wafer 4 at the time of the processing of the wafer 4.

Referring to FIG. 14, the discard part 276 includes a belt conveyor 300 that conveys the separated ring-shaped reinforcing part 24, and a dust box 302 in which the ring-shaped reinforcing part 24 conveyed by the belt conveyor 300 is housed. The belt conveyor 300 is positioned by an appropriate actuator (not illustrated) to a collection position (a position illustrated by solid lines in FIG. 14) at which the belt conveyor 300 horizontally extends substantially and a standby position (a position illustrated by two-dot chain lines in FIG. 14) at which the belt conveyor 300 vertically extends substantially.

A door 304 to which a handle 304a is attached is provided at the side surface of the dust box 302 on the near side in the X-axis direction in FIG. 14. A crusher (not illustrated) that crushes the collected ring-shaped reinforcing part 24 is attached inside the dust box 302. The dust box 302 is configured in such a manner that crushed waste of the ring-shaped reinforcing part 24 housed in the dust box 302 can be taken out by grasping the handle 304a and opening the door 304.

Figure 16:
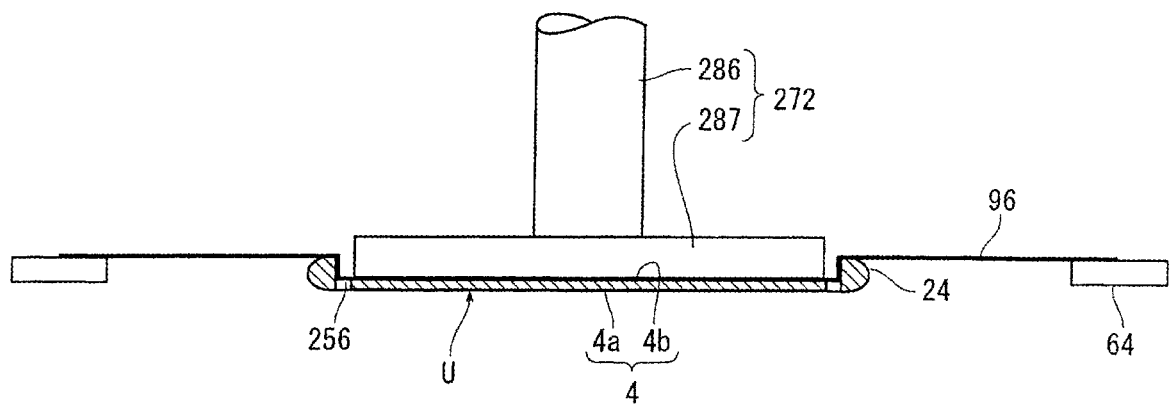
FIG. 16 is a schematic diagram illustrating a state in which the wafer is sucked and held by a second elevating table in the reinforcing part removal step.

When the temporary placement table 204 on which the frame unit U in which the cut groove 256 is formed at the root of the reinforcing part 24 is temporarily placed is positioned below the separating part 248 by the temporary placement table conveying part 232, as illustrated in FIG. 16, the separating part 248 sucks and holds the inside of the wafer 4 by the second elevating table 272 with the ring-shaped reinforcing part 24 exposed to the outer circumference.

Figure 17:
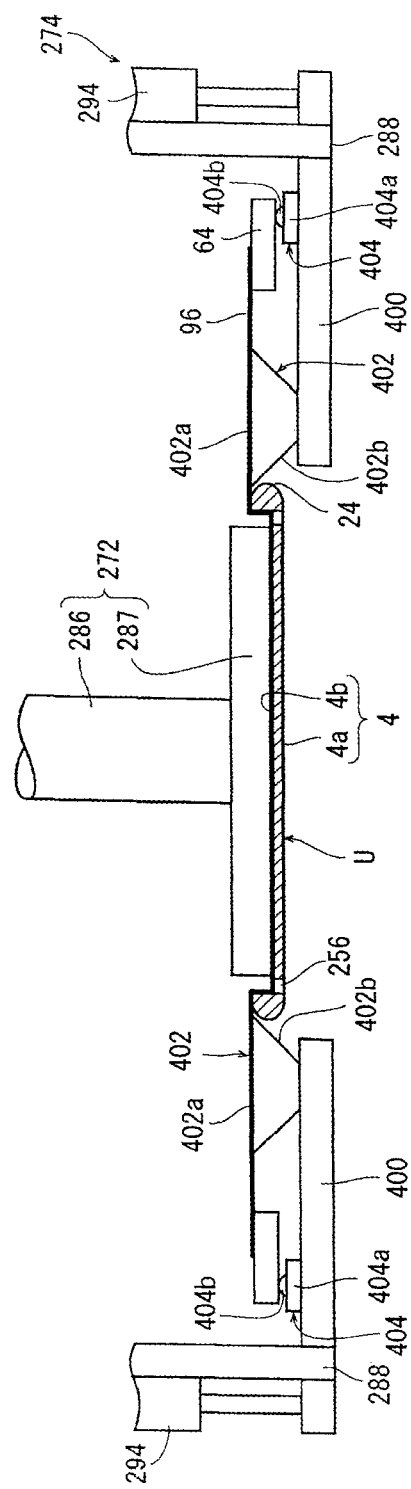
FIG. 17 is a schematic diagram illustrating a state in which the tops of the reinforcing part removing unit are caused to act on an outer circumference of the ring-shaped reinforcing part in the reinforcing part removal step.

Subsequently, the movable pieces 288 are moved by the feed mechanisms 290 and the support plates 400 are moved by the Z-axis feed mechanisms 294 and, as illustrated in FIG. 17, the tops 402 having the wedges are caused to act on the outer circumference of the ring-shaped reinforcing part 24. Specifically, the wedges of the tops 402 are positioned between the tape 96 and the reinforcing part 24. Further, a lower surface of the frame 64 is brought into contact with the spheres 404b of the frame support parts 404, and the frame 64 is supported by the spheres 404b.

Figure 18:
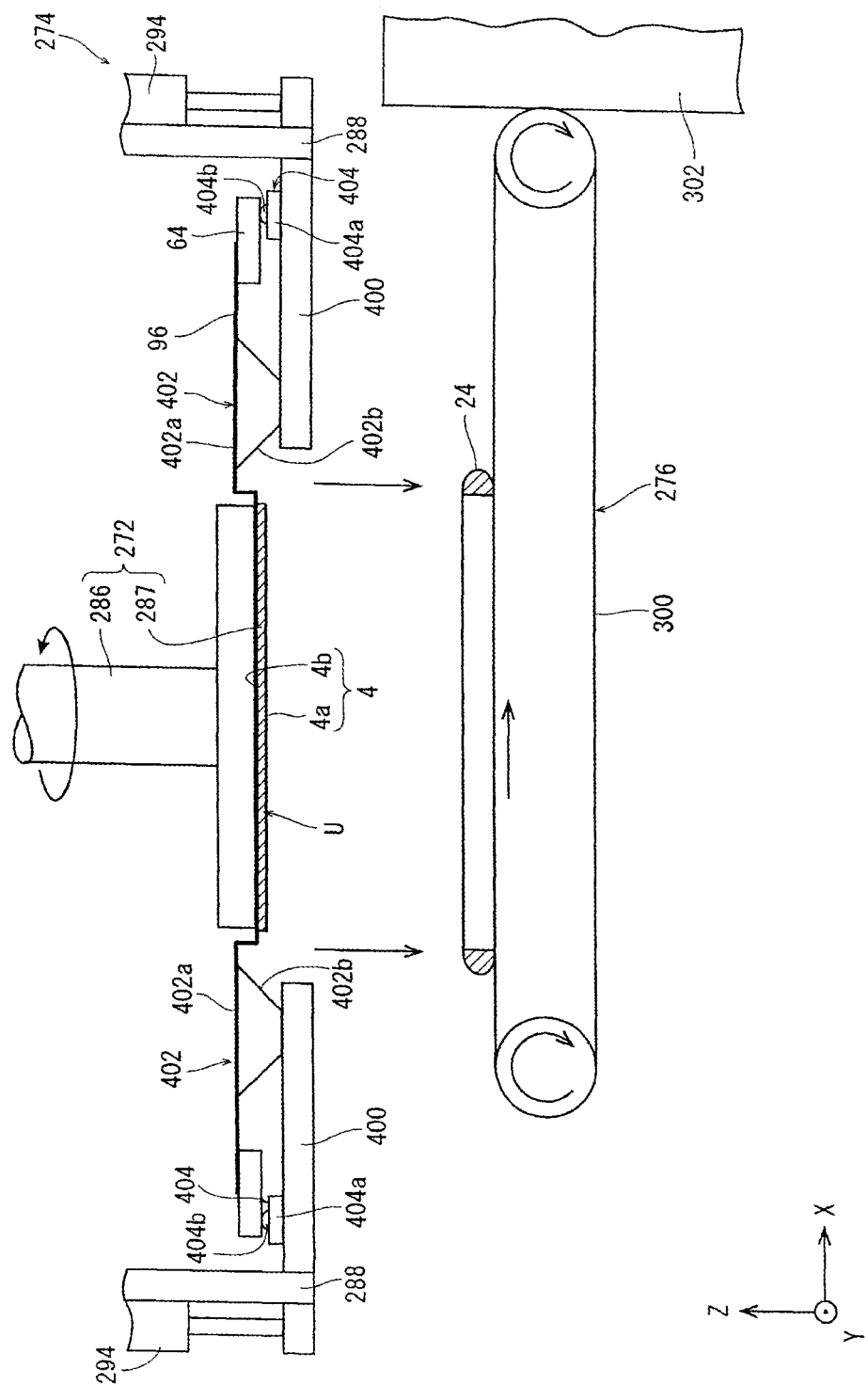
FIG. 18 is a schematic diagram illustrating a state in which the reinforcing part has been separated from the wafer in the reinforcing part removal step.

Next, irradiation with ultraviolet from the pair of ultraviolet irradiation parts 270 is executed to reduce the adhesive force of the tape 96 stuck to the ring-shaped reinforcing part 24. In addition, the frame unit U is rotated together with the second elevating table 272 by the motor 284 relative to the separator 274. As a result, the tape 96 in which the adhesive force has been reduced and the reinforcing part 24 are detached by the wedges of the tops 402. Thus, as illustrated in FIG. 18, the ring-shaped reinforcing part 24 can be separated from the frame unit U. The separated reinforcing part 24 is conveyed to the dust box 302 by the belt conveyor 300 and is collected. When the reinforcing part 24 is separated, the separator 274 may be rotated relative to the frame unit U.

Moreover, when the reinforcing part 24 is separated, ionized air is blown from the ionizer 406 toward the frame unit U. Due to this, even when static electricity is generated due to contact of the tops 402 with the tape 96 and the reinforcing part 24, the static electricity is removed by the ionized air blown from the ionizer 406. This keeps the tape 96 and the reinforcing part 24 from being attracted to each other due to the static electricity, and the reinforcing part 24 is surely separated from the frame unit U.

When the reinforcing part 24 is separated, in association with the relative rotation of the frame unit U and the separator 274, the tops 402 that act on the frame unit U rotate, and the spheres 404b in contact with the lower surface of the frame 64 rotate. Hence, the relative rotation of the frame unit U and the separator 274 is smoothly executed.

Figure 19:
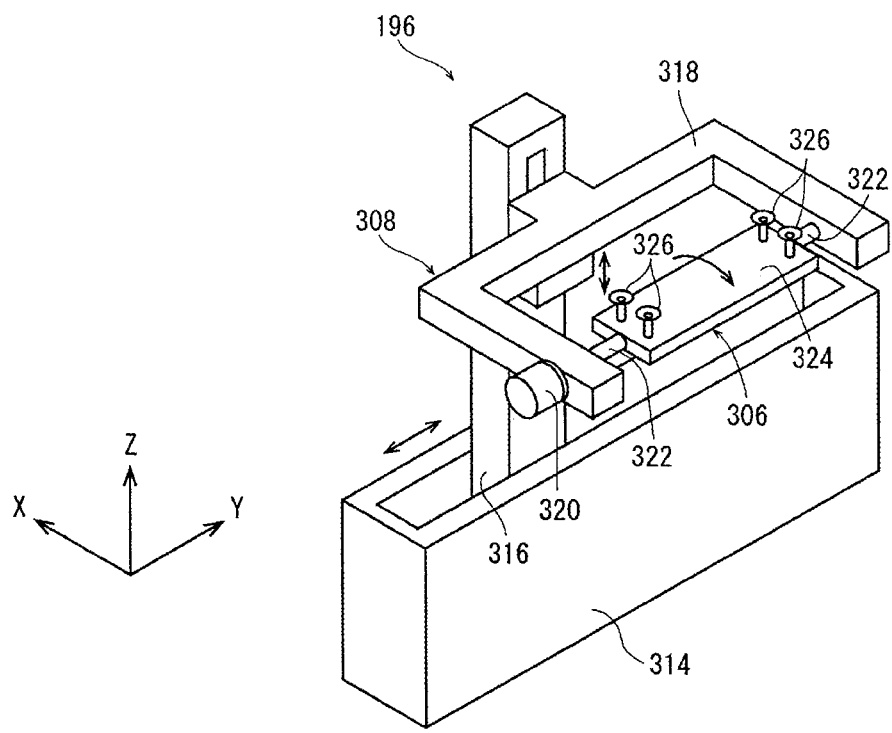
FIG. 19 is a perspective view of an inversion mechanism of a ring-free unit carrying-out mechanism illustrated in FIG. 1.
Figure 20:
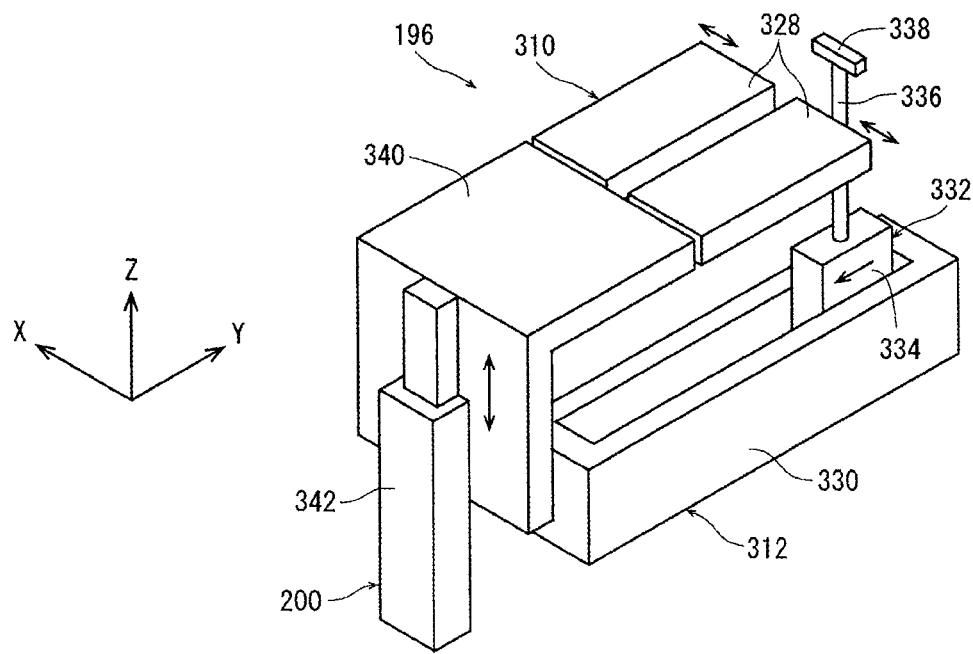
FIG. 20 is a perspective view of a ring-free unit support part and a pushing part of the ring-free unit carrying-out mechanism illustrated in FIG. 1.

As illustrated in FIG. 1, the ring-free unit carrying-out mechanism 196 is disposed adjacent to the reinforcing part removing unit 194. Referring to FIG. 19 and FIG. 20, the ring-free unit carrying-out mechanism 196 of the illustrated embodiment includes an inversion mechanism 308 (see FIG. 19) that includes a frame holding part 306 that faces the ring-free unit supported by the second elevating table 272 and holds the frame 64 and moves toward the frame cassette table 200 and inverts the frame holding part 306, a ring-free unit support part 310 (see FIG. 20) that supports the ring-free unit that is inverted by the inversion mechanism 308 and in which the front surface 4a of the wafer 4 is oriented upward, and a pushing part 312 (see FIG. 20) that causes the ring-free unit supported by the ring-free unit support part 310 to enter the frame cassette 198 placed on the frame cassette table 200 and be housed therein.

As illustrated in FIG. 19, the inversion mechanism 308 includes a Y-axis guide component 314 that extends in the Y-axis direction, a Y-axis movable component 316 supported by the Y-axis guide component 314 movably in the Y-axis direction, a Y-axis feed mechanism (not illustrated) that moves the Y-axis movable component 316 in the Y-axis direction, an arm 318 supported by the Y-axis movable component 316 movably in the Z-axis direction, and a Z-axis feed mechanism (not illustrated) that moves the arm 318 in the Z-axis direction. Each of the Y-axis and Z-axis feed mechanisms of the inversion mechanism 308 may include a ball screw and a motor that rotates the ball screw.

The above-described frame holding part 306 is supported by the arm 318 in such a manner as to be capable of vertically inverting. In addition, a motor 320 that vertically inverts the frame holding part 306 is attached to the arm 318. The frame holding part 306 of the illustrated embodiment includes a holding plate 324 rotatably supported by the arm 318 through a pair of rotating shafts 322 and plural suction pads 326 attached to a single surface of the holding plate 324. Each suction pad 326 is connected to a suction source (not illustrated). Further, one rotating shaft 322 is coupled to the motor 320.

In a state in which the suction pads 326 are oriented upward, the inversion mechanism 308 sucks and holds, by the suction pads 326, the lower surface of the frame 64 of a ring-free unit U' supported by the second elevating table 272 and receives the ring-free unit U' from the second elevating table 272. Further, the inversion mechanism 308 inverts the frame holding part 306 by the motor 320 to orient the front surface 4a of the wafer 4 upward, and then moves the ring-free unit U' held by the frame holding part 306 toward the frame cassette table 200 by moving the Y-axis movable component 316.

As illustrated in FIG. 20, the ring-free unit support part 310 of the illustrated embodiment includes a pair of support plates 328 supported through an appropriate bracket (not illustrated) movably in the X-axis direction and an interval adjusting mechanism (not illustrated) that adjusts the interval between the pair of support plates 328 in the X-axis direction. The interval adjusting mechanism can be configured from an appropriate actuator such as an air cylinder or an electric cylinder.

A heater (not illustrated) is mounted on the pair of support plates 328 that support the ring-free unit U'. In a state in which the interval between the pair of support plates 328 is narrowed, the pair of support plates 328 heat the tape 96 of the ring-free unit U' by the heater and thereby eliminate slack and wrinkles of the tape 96 caused due to the removal of the reinforcing part 24.

The description will be continued with reference to FIG. 20. The pushing part 312 of the illustrated embodiment includes a Y-axis guide component 330 that extends in the Y-axis direction, a Y-axis movable component 332 supported by the Y-axis guide component 330 movably in the Y-axis direction, and a Y-axis feed mechanism (not illustrated) that moves the Y-axis movable component 332 in the Y-axis direction. The Y-axis movable component 332 has a base part 334 supported by the Y-axis guide component 330, a support column 336 that extends upward from an upper surface of the base part 334, and a pressing piece 338 attached to an upper end of the support column 336. The Y-axis feed mechanism of the pushing part 312 may include a ball screw that is coupled to the Y-axis movable component 332 and extends in the Y-axis direction and a motor that rotates this ball screw.

Figure 21:
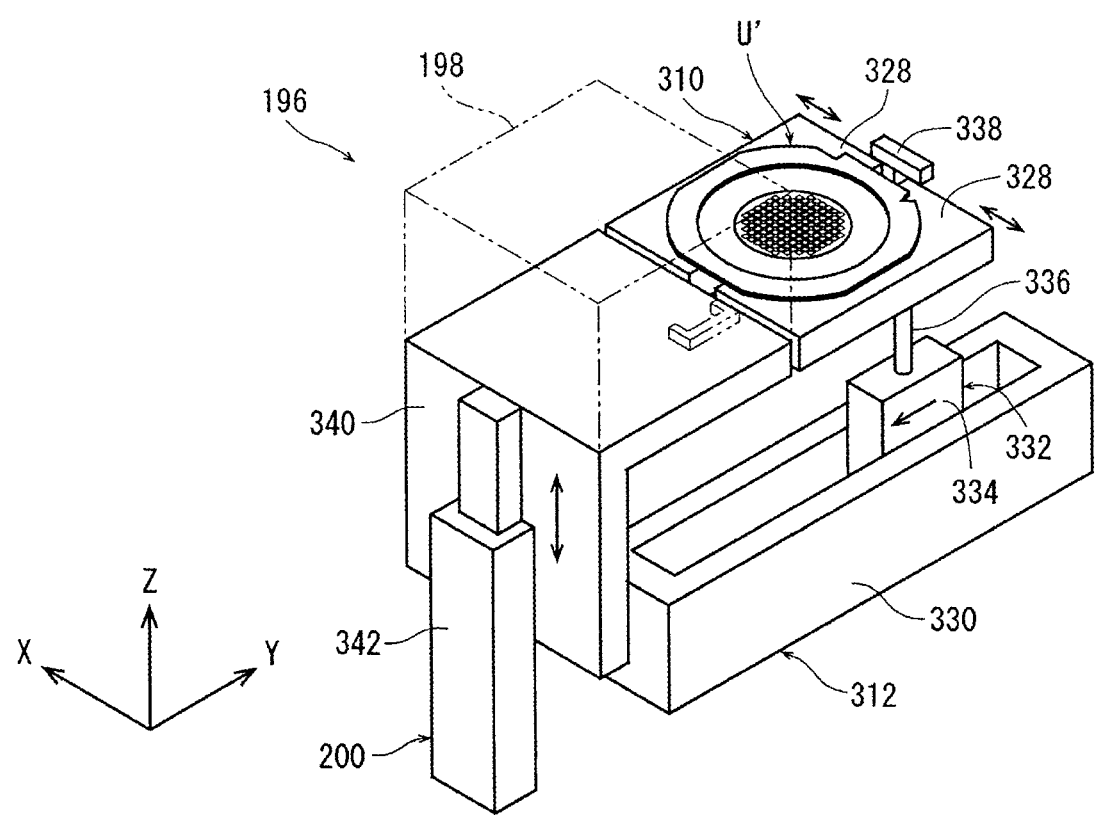
FIG. 21 is a perspective view illustrating a state in which a ring-free unit housing step is being executed.

As illustrated in FIG. 21, the ring-free unit support part 310 expands the interval between the pair of support plates 328 by the interval adjusting mechanism before receiving the ring-free unit U', and then receives the ring-free unit U' held by the suction pads 326. Then, when the ring-free unit support part 310 has received the ring-free unit U', the pushing part 312 moves the Y-axis movable component 332 in the Y-axis direction by the Y-axis feed mechanism and thereby causes, by the pressing piece 338, the ring-free unit U' supported by the ring-free unit support part 310 to enter the frame cassette 198 placed on the frame cassette table 200 and be housed therein.

In the frame cassette 198 illustrated in FIG. 1 and FIG. 21, plural ring-free units U' are housed at intervals in the upward-downward direction in a state in which the front surfaces 4a of the wafers 4 are oriented upward. As illustrated in FIG. 20 and FIG. 21, the frame cassette table 200 includes a placement part 340 on which the frame cassette 198 is placed and an elevating part 342 that raises and lowers the placement part 340 and positions it to a freely selected height. The elevating part 342 may include a ball screw that is coupled to the placement part 340 and extends in the Z-axis direction and a motor that rotates this ball screw.

Next, description will be given regarding a processing method in which, by use of the above-described processing apparatus 2, the dicing tape 96 is stuck to the back surface 4b of the wafer 4 in which the ring-shaped reinforcing part 24 is formed into a projecting shape on a part of the back surface 4b corresponding to the outer circumferential surplus region 20 to integrate the wafer 4 with the frame 64 and the ring-shaped reinforcing part 24 is cut to be removed from the wafer 4.

In the illustrated embodiment, first, as illustrated in FIG. 1 and FIG. 3, a wafer cassette placement step of placing the wafer cassette 6 in which plural wafers 4 are housed on the wafer cassette table 8 is executed. In the wafer cassette 6, plural wafers 4 are housed at intervals in the upward-downward direction in a state in which the front surfaces 4a are oriented upward.

Further, as illustrated in FIG. 1 and FIG. 5, a frame housing step of housing plural ring-shaped frames 64 in which the opening part 64a that houses the wafer 4 is formed in the frame housing unit 66 is executed. The frame housing step may be executed before the wafer cassette placement step or may be executed after the wafer cassette placement step.

In the frame housing step, after the elevating plate 74 of the frame housing unit 66 is lowered to a freely selected position, the handle 76a is grasped, the door 76 is opened, and the plural frames 64 are stacked on the upper surface of the elevating plate 74 to be housed. Further, the height of the elevating plate 74 is adjusted as appropriate, and the frame 64 at the uppermost level is positioned to a position from which this frame 64 can be carried out by the frame carrying-out mechanism 68.

After the wafer cassette placement step and the frame housing step are executed, a wafer carrying-out step of carrying out the wafer 4 from the wafer cassette 6 placed on the wafer cassette table 8 is executed.

Referring to FIG. 3, in the wafer carrying-out step, first, the Y-axis feed mechanism 34 of the wafer carrying-out mechanism 10 is actuated, and the Y-axis movable component 32 is positioned near the wafer cassette table 8. Subsequently, the conveying arm 42 is driven, and the hand 44 in which the gas jet ports 46 are oriented upward is positioned to the side of the back surface 4b (lower side) of the wafer 4 in the wafer cassette 6. When the hand 44 is positioned to the side of the back surface 4b of the wafer 4, a gap is provided between the back surface 4b of the wafer 4 and the hand 44, and each guide pin 48 is positioned outside in the radial direction.

Next, inert gas of $N_2$ or the like is jetted from the gas jet ports 46 of the hand 44 to generate a negative pressure on a single surface side of the hand 44 by the Bernoulli effect, and the wafer 4 is sucked and supported from the side of the back surface 4b by the hand 44 in a contactless manner. Subsequently, each guide pin 48 is moved inward in the radial direction, and horizontal movement of the wafer 4 sucked and supported by the hand 44 is restricted by the respective guide pins 48. Then, the Y-axis movable component 32 and the conveying arm 42 of the wafer carrying-out mechanism 10 are moved, and the wafer 4 sucked and supported by the hand 44 is carried out from the wafer cassette 6. Because the wafer carrying-out mechanism 10 of the illustrated embodiment sprays the inert gas of $N_2$ or the like onto the back surface 4b of the wafer 4 when carrying out the wafer 4, oxidation of the back surface 4b of the wafer 4 can be suppressed.

It is preferable to execute a notch detection step of detecting the position of the notch 26 of the wafer 4 after executing the wafer carrying-out step. In the notch detection step, as illustrated in FIG. 4, the outer circumference of the wafer 4 sucked and supported by the hand 44 is positioned between the light emitting element 52 and the light receiving element 54 of the notch detecting unit 50. Next, by rotating the wafer 4 by the drive source through the guide pin 48, the position of the notch 26 of the wafer 4 is detected. This makes it possible to adjust the orientation of the wafer 4 to a freely selected orientation.

After the notch detection step is executed, a wafer support step of supporting the side of the front surface 4a of the wafer 4 carried out by the wafer carrying-out mechanism 10 by the wafer table 12 is executed.

Referring to FIG. 3, in the wafer support step, first, the hand 44 of the wafer carrying-out mechanism 10 is inverted upside down to orient the front surface 4a of the wafer 4 downward. Subsequently, the Y-axis movable component 32 and the conveying arm 42 of the wafer carrying-out mechanism 10 are moved, and the outer circumferential surplus region 20 of the front surface 4a of the wafer 4 sucked and supported by the hand 44 is brought into contact with the annular support part 56 of the wafer table 12. At this time, the device region 18 of the front surface 4a of the wafer 4 is located in the recess 62 of the wafer table 12. Consequently, the devices 14 do not get contact with the wafer table 12 and damage to the devices 14 is prevented.

Next, the outer circumferential surplus region 20 of the front surface 4a of the wafer 4 is sucked and held by actuating the suction source of the wafer table 12 and generating a suction force for each suction hole 60. Subsequently, the suction support of the wafer 4 by the hand 44 is released, and the hand 44 is separated from the wafer table 12. In this manner, the wafer 4 is transferred from the wafer carrying-out mechanism 10 to the wafer table 12. Because the wafer 4 transferred to the wafer table 12 is sucked and held by each suction hole 60, the position of the wafer 4 does not deviate.

When the wafer 4 has been transferred to the wafer table 12, heating of the wafer 4 by the heating unit of the wafer table 12 is started in order to improve the efficiency of pressure bonding between the back surface 4b of the wafer 4 and the tape 96 having adhesiveness in a tape pressure bonding step to be described later. The temperature of the heating of the wafer 4 by the heating unit of the wafer table 12 may be approximately 30° C. to 50° C. However, when the tape 96 is a thermocompression bonding sheet, the wafer 4 is heated to a temperature at which the thermocompression bonding sheet softens or melts (for example, approximately 120° C.).

Further, along with the start of the heating of the wafer 4, inert gas is sprayed from the upper chamber 160 disposed above the wafer table 12 toward the back surface 4b of the wafer 4. This can suppress oxidation of the back surface 4b of the heated wafer 4. The spray of the inert gas from the upper chamber 160 continues until the tape 96 of the tape-attached frame 64' is positioned above the wafer 4.

Further, after the wafer cassette placement step and the frame housing step are executed, a frame carrying-out step of carrying out the frame 64 from the frame housing unit 66 is executed concurrently with the wafer carrying-out step and the wafer support step.

Referring to FIG. 5, in the frame carrying-out step, first, the X-axis movable component 84 and the Z-axis movable component 86 of the frame carrying-out mechanism 68 are moved, and the suction pads 92 of the holding part 88 are brought into contact with an upper surface of the frame 64 at the uppermost level housed in the frame housing unit 66. Next, the frame 64 at the uppermost level is sucked and held by the suction pads 92 by actuating the suction source of the frame carrying-out mechanism 68 and generating a suction force for the suction pads 92. Then, the X-axis movable component 84 and the Z-axis movable component 86 of the frame carrying-out mechanism 68 are moved, and the frame 64 at the uppermost level sucked and held by the suction pads 92 of the holding part 88 is carried out from the frame housing unit 66.

After the frame carrying-out step is executed, a frame support step of supporting the frame 64 carried out by the frame carrying-out mechanism 68 by the frame table 70 is executed.

The description will be continued with reference to FIG. 5. In the frame support step, first, the X-axis movable component 84 and the Z-axis movable component 86 of the frame carrying-out mechanism 68 are moved, and the frame 64 sucked and held by the suction pads 92 is brought into contact with an upper surface of the frame table 70. At this time, the frame table 70 is positioned to the lowering position (position illustrated by solid lines in FIG. 5) in advance. Subsequently, the suction force of the suction pads 92 of the frame carrying-out mechanism 68 is deactivated to place the frame 64 on the frame table 70. Then, the X-axis movable component 84 and the Z-axis movable component 86 of the frame carrying-out mechanism 68 are moved and the holding part 88 is separated from a position above the frame table 70.

After the frame support step is executed, a tape sticking step of sticking the tape 96 to the frame 64 is executed.

Referring to FIG. 6A and FIG. 6B, in the tape sticking step, first, before the frame table 70 is moved from the lowering position (the position illustrated in FIG. 6A) to the rising position (the position illustrated in FIG. 6B) with which the tape 96 can be stuck to the frame 64, the tape 96 is pulled out from the roll tape 96R and the tape 96 from which the release paper 116 has been separated is positioned above the frame table 70. The adhesive surface of the tape 96 located above the frame table 70 is oriented downward.

Next, the frame table 70 is raised to such an extent that the tape 96 can be pressed against the frame 64 from the upper side by the pressing roller 132 of the pressure bonding part 110 of the tape sticking unit 98. Then, the pressing roller 132 is rolled in the Y-axis direction while the adhesive surface of the tape 96 is pressed against the frame 64 by the pressing roller 132. As a result, the tape 96 pulled out from the roll tape 96R by the tape pull-out part 108 can be pressure-bonded to the frame 64.

When the tape 96 is a thermocompression bonding sheet, thermocompression bonding of the tape 96 to the frame 64 can be executed by rolling the pressing roller 132 in the Y-axis direction while pressing the tape 96 against the frame 64 by the pressing roller 132 after adjusting the temperature of the outer circumferential surface of the pressing roller 132 to a temperature at which the tape 96 softens or melts.

Subsequently, the cutter 144 and the holding-down roller 146 of the cutting part 112 of the tape sticking unit 98 are lowered to press the cutter 144 against the tape 96 on the frame 64 and hold down the frame 64 by the holding-down roller 146 from over the tape 96. Next, the arm piece 140 is rotated by the motor 138, and the cutter 144 and the holding-down roller 146 are moved to draw a circle along the frame 64. Accordingly, the tape 96 that protrudes to the outer circumference of the frame 64 can be cut along the frame 64.

Further, because the frame 64 is held down by the holding-down roller 146 from over the tape 96, deviation of the position of the frame 64 and the tape 96 is prevented when the tape 96 is being cut. The used tape 96 in which the circular opening part 120 is formed is taken up by the tape take-up part 106.

After the tape sticking step is executed, a tape-attached frame conveyance step of conveying the frame 64 to which the tape 96 is stuck to the wafer table 12 and positioning the opening part 64a of the frame 64 to the back surface 4b of the wafer 4 supported by the wafer table 12 and placing the tape-attached frame 64' on the wafer table 12 is executed.

In the tape-attached frame conveyance step, first, the frame table 70 is moved from the rising position to the lowering position. Subsequently, the Y-axis movable component 150 and the Z-axis movable component 152 of the tape-attached frame conveying mechanism 100 (see FIG. 5) are moved, and the respective suction pads 158 of the holding part 154 of the tape-attached frame conveying mechanism 100 are brought into contact with the upper surface of the tape-attached frame 64' (see FIG. 7) supported by the frame table 70 in the state in which the adhesive surface of the tape 96 is oriented downward.

Next, the upper surface of the tape-attached frame 64' is sucked and held by the suction pads 158 by actuating the suction source of the tape-attached frame conveying mechanism 100 and generating a suction force for the suction pads 158. Subsequently, the Y-axis movable component 150 and the Z-axis movable component 152 of the tape-attached frame conveying mechanism 100 are moved, and the tape-attached frame 64' sucked and held by the suction pads 158 is carried out from the frame table 70.

Next, the tape-attached frame 64' sucked and held by the suction pads 158 of the tape-attached frame conveying mechanism 100 is conveyed to the wafer table 12. Then, as illustrated in FIG. 7, the opening part 64a of the frame 64 is positioned to the back surface 4b of the wafer 4 supported by the wafer table 12, and the tape-attached frame 64' is brought into contact with the frame support part 58 of the wafer table 12. At this time, the adhesive surface of the tape 96 of the tape-attached frame 64' is oriented downward, and the back surface 4b of the wafer 4 is oriented upward and faces the adhesive surface of the tape 96.

When the tape 96 of the tape-attached frame 64' has been positioned to the back surface 4b of the wafer 4 supported by the wafer table 12, the valve 175 is closed to stop the spray of the inert gas from the upper chamber 160. Subsequently, the suction force of the suction pads 158 of the tape-attached frame conveying mechanism 100 is deactivated to place the tape-attached frame 64' on the frame support part 58 of the wafer table 12. Then, the Y-axis movable component 150 and the Z-axis movable component 152 of the tape-attached frame conveying mechanism 100 are moved, and the holding part 154 is separated from the upper side of the wafer table 12.

After the tape-attached frame conveyance step is executed, the tape pressure bonding step of executing pressure bonding of the tape 96 of the tape-attached frame 64' to the back surface 4b of the wafer 4 is executed.

Figure 8:
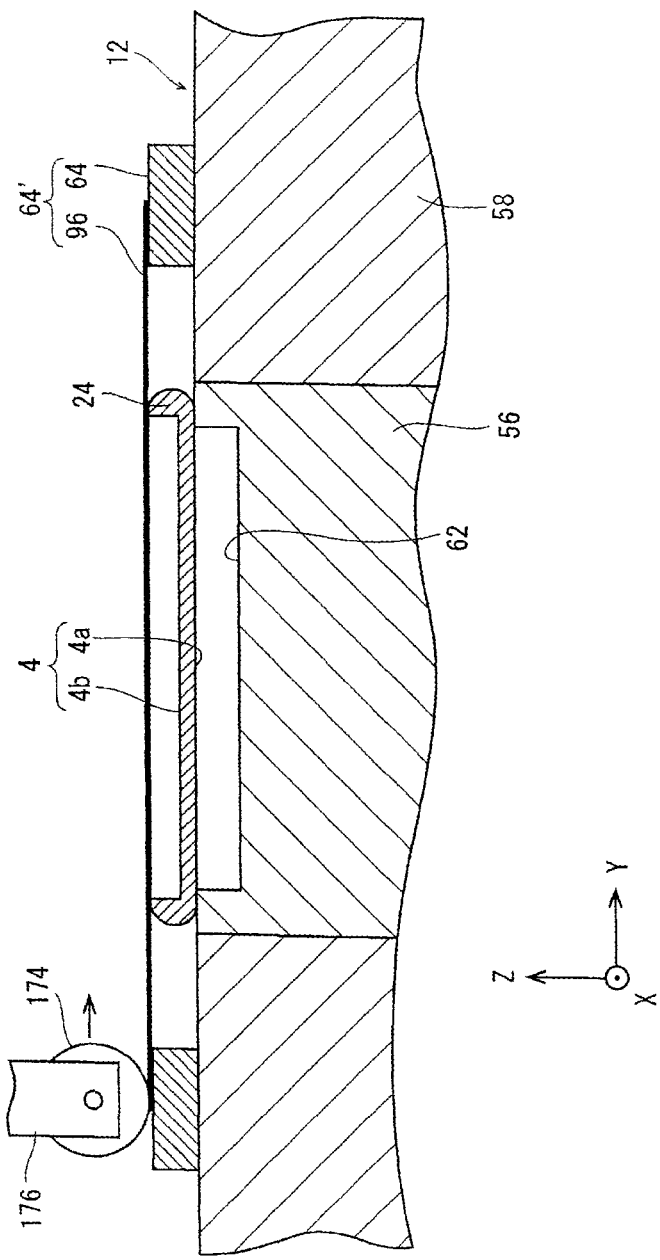
FIG. 8 is a sectional view illustrating a state in which pressing of a tape by a pressing roller is started in a tape pressure bonding step.
Figure 9:
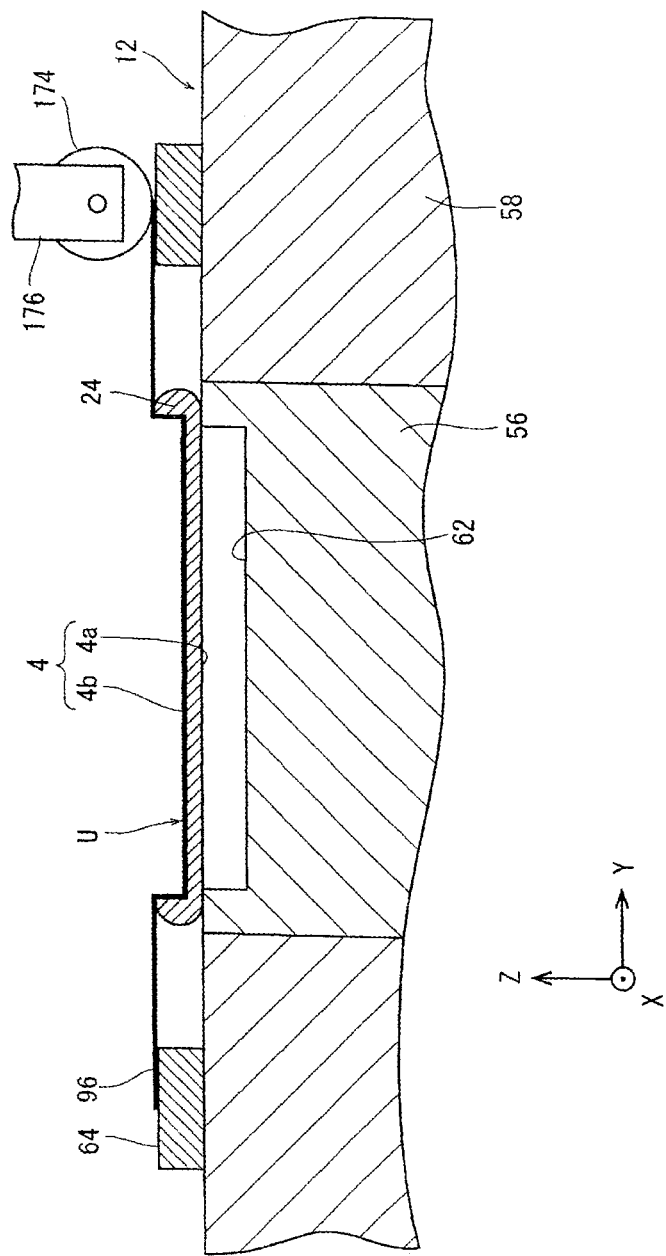
FIG. 9 is a sectional view illustrating a state in which the pressing of the tape by the pressing roller has ended in the tape pressure bonding step.

Referring to FIG. 7 to FIG. 9, in the tape pressure bonding step, first, the upper chamber 160 is lowered by the elevating mechanism 164 of the tape pressure bonding unit 102, and a lower end of the sidewall 172 of the upper chamber 160 is brought into contact with an upper end of the sidewall 186 of the lower chamber 162. Accordingly, the upper chamber 160 and the lower chamber 162 are put into the closed state. In addition, the pressing roller 174 is brought into contact with the tape-attached frame 64'. As a result, as illustrated in FIG. 8, an upper end of the ring-shaped reinforcing part 24 of the wafer 4 sticks to the adhesive surface of the tape 96 of the tape-attached frame 64'.

Next, the vacuum part 166 of the tape pressure bonding unit 102 is actuated in a state in which the opening-to-atmosphere part 168 is closed, and the inside of the upper chamber 160 and the lower chamber 162 is put into a vacuum state. Subsequently, as illustrated in FIG. 8 and FIG. 9, pressure bonding of the tape 96 to the back surface 4b of the wafer 4 is executed by rolling the pressing roller 174 of the tape pressure bonding unit 102 in the Y-axis direction. As a result, the frame unit U in which the back surface 4b of the wafer 4 and the tape 96 are pressure-bonded can be generated.

Further, when the tape 96 is a thermocompression bonding sheet, thermocompression bonding of the tape 96 to the back surface 4b of the wafer 4 can be executed by rolling the pressing roller 174 in the Y-axis direction after heating the wafer 4 to a temperature at which the tape 96 softens or melts by the heating unit of the wafer table 12.

Next, the opening-to-atmosphere part 168 is opened, and the tape 96 is brought into close contact with the back surface 4b of the wafer 4 along the root of the ring-shaped reinforcing part 24 by the atmospheric pressure. Then, the upper chamber 160 is raised by the elevating mechanism 164.

Due to the setting of the inside of the upper chamber 160 and the lower chamber 162 to the vacuum state, the suction force for the wafer 4 by the wafer table 12 is lost. However, when the upper chamber 160 and the lower chamber 162 are set to the closed state, the upper end of the ring-shaped reinforcing part 24 of the wafer 4 sticks to the adhesive surface of the tape 96 of the tape-attached frame 64'. Thus, the position of the wafer 4 does not deviate in the tape pressure bonding step.

After the tape pressure bonding step is executed, a frame unit carrying-out step of carrying out, from the wafer table 12, the frame unit U in which the tape 96 of the tape-attached frame 64' and the back surface 4b of the wafer 4 are pressure-bonded is executed.

Referring to FIG. 5, in the frame unit carrying-out step, first, the conveying part 206 of the frame unit carrying-out mechanism 192 is actuated, and the lower surface of the suction piece 210 of the wafer holding part 202a of the frame unit holding part 202 is brought into contact with the tape 96 on the side of the back surface 4b of the wafer 4. In addition, the suction pads 214 of the frame holding part 202b are brought into contact with the frame 64.

Subsequently, a suction force is generated for the suction piece 210 of the wafer holding part 202a and the suction pads 214 of the frame holding part 202b, and the wafer 4 is sucked and held from the side of the back surface 4b (the side of the tape 96) by the suction piece 210 of the wafer holding part 202a. In addition, the frame 64 is sucked and held by the suction pads 214 of the frame holding part 202b. Next, the suction holding of the wafer 4 by the wafer table 12 is released. Then, the conveying part 206 is actuated and the frame unit U held by the frame unit holding part 202 is carried out from the wafer table 12.

After the frame unit carrying-out step is executed, a temporary placement step of making the center of the wafer 4 correspond with the center of the temporary placement table 204 and temporarily placing the frame unit U on the temporary placement table 204 is executed.

Referring to FIG. 10, in the temporary placement step, first, the frame unit U held by the frame unit holding part 202 is positioned above the imaging part 224. Subsequently, the conveying part 206 that configures the two-dimensional movement mechanism of the frame unit carrying-out mechanism 192 is actuated, and at least three places at the outer circumference of the wafer 4 of the frame unit U held by the frame unit holding part 202 are imaged by the imaging part 224. Accordingly, the coordinates of at least three points at the outer circumference of the wafer 4 are measured. Next, the center coordinates of the wafer 4 are obtained based on the measured coordinates of the three points.

Subsequently, the conveying part 206 is actuated, and the center of the wafer 4 is positioned to the center of the annular support part 226 of the temporary placement table 204, and the outer circumferential surplus region 20 of the front surface 4a of the wafer 4 is brought into contact with an upper surface of the annular support part 226 of the temporary placement table 204. In addition, the lower surface of the frame 64 is brought into contact with an upper surface of the frame support part 228 of the temporary placement table 204. At this time, the front surface 4a of the wafer 4 is oriented downward. However, because the device region 18 is located in the recess 230 of the temporary placement table 204, the devices 14 do not get contact with the temporary placement table 204, and damage to the devices 14 is prevented.

Next, the suction holding of the wafer 4 by the wafer holding part 202a is released, and the suction holding of the frame 64 by the frame holding part 202b is released, to transfer the frame unit U from the frame unit carrying-out mechanism 192 to the temporary placement table 204. Subsequently, the heater of the frame support part 228 is actuated to heat the tape 96 of the frame unit U temporarily placed on the temporary placement table 204 by the heater. Due to this, the tape 96 softens and is brought into close contact with the root of the ring-shaped reinforcing part 24 of the wafer 4.

After the temporary placement step is executed, a reinforcing part removal step of cutting and removing the ring-shaped reinforcing part 24 from the wafer 4 of the frame unit U carried out by the frame unit carrying-out mechanism 192 is executed.

Referring to FIG. 1, FIG. 10, and FIG. 12, in the reinforcing part removal step, first, the X-axis movable component 260 and the Z-axis movable component 262 of the first elevating table 246 of the reinforcing part removing unit 194 are moved, and the lower surface of the suction piece 268 is brought into contact with the upper surface of the frame 64 of the frame unit U temporarily placed on the temporary placement table 204. Next, a suction force is generated for each suction hole of the suction piece 268 of the first elevating table 246, and the part of the frame 64 of the frame unit U is sucked and held.

Subsequently, the X-axis movable component 260 and the Z-axis movable component 262 of the first elevating table 246 are actuated, and as illustrated in FIG. 11, the frame unit U sucked and held by the suction piece 268 is positioned above the laser beam irradiation unit 244. Next, the focal point of the laser beam LB is positioned to the root of the ring-shaped reinforcing part 24 of the wafer 4 of the frame unit U.

Subsequently, while the suction piece 268 and the frame unit U are rotated by the motor 266 of the first elevating table 246, the root of the ring-shaped reinforcing part 24 of the wafer 4 is irradiated with the laser beam LB. This can execute ablation processing for the root of the ring-shaped reinforcing part 24 of the wafer 4 to form the ring-shaped cut groove 256. Further, when the wafer 4 is irradiated with the laser beam LB, the suction source of the laser beam irradiation unit 244 is actuated to generate a suction force for the suction nozzle 254, and debris generated due to the ablation processing is sucked by the suction nozzle 254.

Next, the X-axis movable component 260 and the Z-axis movable component 262 of the first elevating table 246 are moved, and the outer circumferential surplus region 20 of the front surface 4a of the wafer 4 of the frame unit U sucked and held by the suction piece 268 is brought into contact with the upper surface of the annular support part 226 of the temporary placement table 204. In addition, the lower surface of the frame 64 is brought into contact with the upper surface of the frame support part 228 of the temporary placement table 204. Subsequently, the suction force of the suction piece 268 of the first elevating table 246 is deactivated to transfer the frame unit U from the first elevating table 246 to the temporary placement table 204.

Next, the temporary placement table 204 that has received the frame unit U is positioned below the separating part 248 of the reinforcing part removing unit 194 by the temporary placement table conveying part 232 (see FIG. 10). At this time, the belt conveyor 300 of the discard part 276 is positioned to the standby position. Subsequently, the second elevating table 272 of the separating part 248 is lowered, and a lower surface of the second elevating table 272 is brought into contact with the tape 96 of the part of the back surface 4b of the wafer 4. Next, a suction force is generated at the lower surface of the second elevating table 272, and, as illustrated in FIG. 16, the inside of the wafer 4 of the frame unit U is sucked and held by the table head 287 of the second elevating table 272 in a state in which the ring-shaped reinforcing part 24 is exposed to the outer circumference.

Subsequently, the second elevating table 272 that sucks and holds the wafer 4 of the frame unit U is raised to separate the frame unit U from the temporary placement table 204. In addition, the temporary placement table 204 is moved to the lower side of the first elevating table 246. Next, the movable pieces 288 are moved by the feed mechanisms 290 and the support plates 400 are moved by the Z-axis feed mechanisms 294. Accordingly, as illustrated in FIG. 17, the tops 402 having the wedges are caused to act on the outer circumference of the ring-shaped reinforcing part 24, and the wedges of the tops 402 are positioned between the tape 96 and the reinforcing part 24. In addition, the frame 64 is supported by the spheres 404b of the frame support parts 404. Further, the belt conveyor 300 of the discard part 276 is positioned from the standby position to the collection position.

Subsequently, irradiation with ultraviolet from the pair of ultraviolet irradiation parts 270 is executed to reduce the adhesive force of the tape 96 sticking to the ring-shaped reinforcing part 24. In addition, the frame unit U is rotated together with the second elevating table 272 by the motor 284 relative to the separator 274. Moreover, ionized air is blown from the ionizer 406 toward the frame unit U. Due to this, the ring-shaped reinforcing part 24 can be separated from the frame unit U as illustrated in FIG. 18. In addition, static electricity generated when the reinforcing part 24 is separated does not remain on the frame unit U. The reinforcing part 24 that has dropped from the frame unit U is conveyed to the dust box 302 by the belt conveyor 300 and is collected. When the reinforcing part 24 is separated, the separator 274 may be rotated relative to the frame unit U.

After the reinforcing part removal step is executed, a ring-free unit carrying-out step of carrying out the ring-free unit U' resulting from the removal of the ring-shaped reinforcing part 24 from the reinforcing part removing unit 194 is executed.

In the ring-free unit carrying-out step, first, the belt conveyor 300 of the discard part 276 of the reinforcing part removing unit 194 is positioned from the collection position to the standby position. Next, the frame holding part 306 of the inversion mechanism 308 (see FIG. 19) of the ring-free unit carrying-out mechanism 196 is positioned below the ring-free unit U' sucked and held by the second elevating table 272.

Subsequently, the arm 318 is raised in a state in which the suction pads 326 of the frame holding part 306 are oriented upward, and the suction pads 326 of the frame holding part 306 are brought into contact with the lower surface side of the frame 64 of the ring-free unit U' in a state in which the ring-free unit U' is supported by the second elevating table 272 and the front surface 4a of the wafer 4 is oriented downward.

Next, a suction force is generated for the suction pads 326 of the frame holding part 306, and the frame 64 of the ring-free unit U' is sucked and held by the suction pads 326. Subsequently, the suction holding of the ring-free unit U' by the second elevating table 272 is released. Accordingly, the ring-free unit U' is transferred from the second elevating table 272 of the reinforcing part removing unit 194 to the frame holding part 306 of the ring-free unit carrying-out mechanism 196.

After the ring-free unit carrying-out step is executed, a ring-free unit housing step of housing the ring-free unit U' carried out by the ring-free unit carrying-out mechanism 196 is executed.

In the ring-free unit housing step, first, the inversion mechanism 308 of the ring-free unit carrying-out mechanism 196 is inverted upside down, and the ring-free unit U' sucked and held by the frame holding part 306 is inverted upside down. Due to this, the ring-free unit U' is located under the frame holding part 306, and the front surface 4a of the wafer 4 is oriented upward.

Next, the Y-axis movable component 316 and the arm 318 of the inversion mechanism 308 are moved, and the ring-free unit U' is brought into contact with upper surfaces of the pair of support plates 328 of the ring-free unit support part 310. At this time, the interval between the pair of support plates 328 is narrowed by the interval adjusting mechanism, and the pair of support plates 328 are in close contact with each other.

Subsequently, the suction holding of the ring-free unit U' by the frame holding part 306 is released to place the ring-free unit U' on the pair of support plates 328. Next, slack and wrinkles of the tape 96 caused due to the removal of the reinforcing part 24 are eliminated by actuating the heater mounted on each support plate 328 and heating the tape 96 of the ring-free unit U'. Then, the ring-free unit U' is sucked and held and is raised by the frame holding part 306 again.

Next, after the interval between the pair of support plates 328 is enlarged by the interval adjusting mechanism, the ring-free unit U' is placed on the upper surfaces of the support plates 328. Then, as illustrated in FIG. 21, the ring-free unit U' supported by the ring-free unit support part 310 is pushed by the pressing piece 338 of the pushing part 312, and the ring-free unit U' is caused to enter the frame cassette 198 placed on the frame cassette table 200 and is housed therein.

The configuration of the illustrated embodiment is as above. In the processing apparatus 2 of the illustrated embodiment, work of sticking the dicing tape 96 to the back surface 4b of the wafer 4 in which the ring-shaped reinforcing part 24 is formed into a projecting shape on the part of the back surface 4b corresponding to the outer circumferential surplus region 20 to integrate the wafer 4 with the frame 64 is easy. In addition, it is easy to cut the ring-shaped reinforcing part 24 and remove it from the wafer 4, and the productivity becomes favorable.

Further, in the processing apparatus 2 of the illustrated embodiment, the inert gas of $N_2$ or the like is sprayed onto the back surface 4b of the wafer 4 when the wafer 4 is carried out by the wafer carrying-out mechanism 10. Therefore, oxidation of the back surface (for example, the back surface coated with a metal film of copper or the like) of the wafer 4 can be suppressed.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A processing apparatus that removes a ring-shaped reinforcing part with a projecting shape from a wafer selected from a plurality of wafers, the ring-shaped reinforcing part being formed into the projecting shape on a part of a back surface of the wafer, the part of the back surface corresponding to an outer circumferential surplus region, the processing apparatus comprising:

a wafer cassette table on which a wafer cassette in which the plurality of wafers are housed is placed;

a wafer carrying-out mechanism that carries out the wafer from the wafer cassette placed on the wafer cassette table;

a wafer table that supports a front surface side of the wafer carried out by the wafer carrying-out mechanism;

a frame housing unit that houses a plurality of ring-shaped frames each of which has an opening part that houses the wafer formed therein;

a frame carrying-out mechanism that carries out the frame from the frame housing unit;

a frame table that supports the frame carried out by the frame carrying-out mechanism;

a tape sticking unit that is disposed above the frame table and sticks a tape to the frame;

a tape-attached frame conveying mechanism that conveys the frame to which the tape is stuck to the wafer table, positions the opening part of the frame to the back surface of the wafer supported by the wafer table, and places a tape-attached frame on the wafer table;

a tape pressure bonding unit that executes pressure bonding of the tape of the tape-attached frame to the back surface of the wafer;

a frame unit carrying-out mechanism that carries out a frame unit in which the tape of the tape-attached frame and the back surface of the wafer are pressure-bonded by the tape pressure bonding unit from the wafer table and temporarily places the frame unit on a temporary placement table;

a reinforcing part removing unit that cuts and removes the ring-shaped reinforcing part from the wafer of the frame unit placed on the temporary placement table;

a ring-free unit carrying-out mechanism that carries out a ring-free unit resulting from the removal of the ring-shaped reinforcing part from the reinforcing part removing unit; and a frame cassette table on which a frame cassette that houses the ring-free unit carried out by the ring-free unit carrying-out mechanism is placed, wherein the wafer carrying-out mechanism includes a Bernoulli chuck mechanism that jets gas to the back surface of the wafer and generates a negative pressure, and the gas is inert gas, and the wafer carrying-out mechanism jets the inert gas from the Bernoulli chuck mechanism to suppress oxidation of the back surface of the wafer when the wafer is carried out.

2. The processing apparatus according to claim 1, wherein the tape pressure bonding unit includes an upper chamber disposed above the wafer table, a lower chamber in which the wafer table is housed, a elevating mechanism that raises and lowers the upper chamber and generates a closed state in which the upper chamber is brought into contact with the lower chamber and an opened state in which the upper chamber is separated from the lower chamber, a vacuum part that sets the upper chamber and the lower chamber to a vacuum state in the closed state, and an opening-to-atmosphere part that opens the upper chamber and the lower chamber to atmosphere, the upper chamber sprays inert gas onto the back surface of the wafer supported by the wafer table to suppress oxidation of the back surface of the wafer, and in a state in which the tape of the tape-attached frame is positioned to the back surface of the wafer, the elevating mechanism is actuated to keep the closed state, the spray of the inert gas is stopped, and a vacuum state is generated, and pressure bonding of the tape of the tape-attached frame to the back surface of the wafer is executed by a pressing roller disposed in the upper chamber.

3. The processing apparatus according to claim 2, wherein the wafer table includes a heating unit.

* * * * *